United States Patent
Lipski et al.

(10) Patent No.: US 10,883,191 B2
(45) Date of Patent: Jan. 5, 2021

(54) METHOD FOR PRODUCING III-N TEMPLATES AND THE REPROCESSING THEREOF AND III-N TEMPLATE

(71) Applicant: FREIBERGER COMPOUND MATERIALS GMBH, Freiberg (DE)

(72) Inventors: Frank Lipski, Reutlingen (DE); Ferdinand Scholz, Ulm (DE); Martin Klein, Ulm (DE); Frank Habel, Freiberg (DE)

(73) Assignee: Freiberger Compound Materials GmbH, Freiberg (DE)

( * ) Notice: Subject to any disclaimer, the term of this patent is extended or adjusted under 35 U.S.C. 154(b) by 0 days.

(21) Appl. No.: 16/425,980

(22) Filed: May 30, 2019

(65) Prior Publication Data
US 2019/0276950 A1    Sep. 12, 2019

Related U.S. Application Data

(62) Division of application No. 14/386,845, filed as application No. PCT/EP2013/055892 on Mar. 21, 2013, now Pat. No. 10,309,037.

(30) Foreign Application Priority Data

Mar. 21, 2012 (DE) .......................... 10 2012 204 551
Mar. 21, 2012 (DE) .......................... 10 2012 204 553

(51) Int. Cl.
C30B 29/40 (2006.01)
C30B 25/16 (2006.01)
(Continued)

(52) U.S. Cl.
CPC .............. *C30B 25/16* (2013.01); *C30B 25/04* (2013.01); *C30B 25/10* (2013.01); *C30B 25/18* (2013.01);
(Continued)

(58) Field of Classification Search
CPC ........... H01L 21/02458; H01L 21/0254; C30B 25/02; C30B 29/406; C30B 25/04; C30B 29/403
See application file for complete search history.

(56) References Cited

U.S. PATENT DOCUMENTS 6,440,823 B1    8/2002 Vaudo et al.
2002/0068201 A1    6/2002 Vaudo et al.
(Continued)

FOREIGN PATENT DOCUMENTS

CN    101258271    9/2008
CN    102208338    10/2011
(Continued)

OTHER PUBLICATIONS

Final U.S. Office Action dated Jul. 5, 2019 for U.S. Appl. No. 15/883,125, filed Jan. 30, 2018.
(Continued)

*Primary Examiner* — Matthew J Song
(74) *Attorney, Agent, or Firm* — A.C. Entis-IP Ltd.; Allan. C. Entis; Kenichi N. Hartman

(57) ABSTRACT

There is provided a template comprising a substrate comprising sapphire and at least one III-N crystal layer, wherein III denotes at least one element of the main group III of the periodic table of the elements, selected from the group of Al, Ga and In, wherein in a region of the at least one III-N layer above the substrate comprises a mask material as an interlayer, wherein the III-N crystal layer of the template is defined by one or both of the following values (i)/(ii) of the
(Continued)

deformation $\varepsilon_{xx}$: (i) at room temperature the $\varepsilon_{xx}$ value lies in the range of <0; and (ii) at growth temperature the $\varepsilon_{xx}$ value lies in the range of $\varepsilon_{xx} \leq 0$.

14 Claims, 6 Drawing Sheets

Related U.S. Application Data

(60) Provisional application No. 61/614,161, filed on Mar. 22, 2012, provisional application No. 61/614,190, filed on Mar. 22, 2012.

(51) Int. Cl.
*C30B 25/18* (2006.01)
*H01L 21/02* (2006.01)
*C30B 25/10* (2006.01)
*C30B 25/04* (2006.01)
*H01L 29/20* (2006.01)

(52) U.S. Cl.
CPC ............ *C30B 29/40* (2013.01); *C30B 29/403* (2013.01); *C30B 29/406* (2013.01); *H01L 21/0242* (2013.01); *H01L 21/0254* (2013.01); *H01L 21/0262* (2013.01); *H01L 21/02436* (2013.01); *H01L 21/02458* (2013.01); *H01L 21/02488* (2013.01); *H01L 29/2003* (2013.01); *Y10T 428/24851* (2015.01)

(56) References Cited

U.S. PATENT DOCUMENTS

| | | | |
|---|---|---|---|
| 2003/0232457 A1 | 12/2003 | Kawaguchi et al. | |
| 2005/0022725 A1* | 2/2005 | Jurgensen | C30B 25/02 117/104 |
| 2005/0064206 A1* | 3/2005 | Akita | C30B 25/02 428/446 |
| 2005/0208687 A1* | 9/2005 | Kasai | C30B 25/02 438/22 |
| 2006/0046325 A1 | 3/2006 | Usui et al. | |
| 2007/0072320 A1 | 3/2007 | Frayssinet et al. | |
| 2007/0141814 A1 | 6/2007 | Leibiger et al. | |
| 2007/0197004 A1 | 8/2007 | Dadgar et al. | |
| 2008/0149942 A1 | 6/2008 | Yi et al. | |
| 2008/0217645 A1 | 9/2008 | Saxler et al. | |
| 2009/0085165 A1 | 4/2009 | Hiramatsu et al. | |
| 2009/0092815 A1 | 4/2009 | Dmitriev et al. | |
| 2010/0096727 A1 | 4/2010 | Hennig et al. | |
| 2011/0127544 A1* | 6/2011 | Paskova | C30B 25/20 257/77 |
| 2011/0140072 A1* | 6/2011 | Varangis | B82Y 20/00 257/9 |
| 2013/0200495 A1 | 8/2013 | Keller et al. | |
| 2013/0256697 A1 | 10/2013 | Dadgar et al. | |
| 2013/0270575 A1* | 10/2013 | Humphreys | H01L 21/02381 257/76 |
| 2014/0299968 A1* | 10/2014 | Wang | H01L 21/0237 257/618 |

FOREIGN PATENT DOCUMENTS

| | | |
|---|---|---|
| CN | 102268737 | 12/2011 |
| DE | 102005041643 | 8/2005 |
| DE | 102006008929 | 2/2006 |
| DE | 102005023302 | 11/2006 |
| DE | 102010056409 | 12/2010 |
| EP | 1501117 | 1/2005 |
| EP | 2136390 | 12/2009 |
| EP | 2299236 | 3/2011 |
| JP | H11191657 | 7/1999 |
| JP | 11354846 | 12/1999 |
| JP | 2010132473 | 6/2010 |
| WO | 2006035212 | 4/2006 |
| WO | 2007068756 | 6/2007 |
| WO | 2007107757 | 9/2007 |
| WO | 2008087452 | 7/2008 |
| WO | 2008096168 | 8/2008 |
| WO | 2012035135 | 3/2012 |

OTHER PUBLICATIONS

Japanese Office Action dated May 22, 2018 for Application No. 2017-009080 filed on Jan. 23, 2017.
Japanese Office Action dated Jul. 4, 2017 for corresponding application No. 2015-500921.
Non-Final U.S. Office Action dated Mar. 28, 2017 for U.S. Appl. No. 14/386,833, filed Sep. 22, 2014.
European Office Action dated Jan. 4, 2017 for corresponding application No. 13712740.3.
European Office Action dated Jan. 10, 2017 for corresponding application No. 13712741.1.
O. Klein et al., TEM investigations on growth interrupted samples for the correlation of the dislocation propagation and growth mode variations in AlGaN deposited on SiNx interlayershe dislocation propagation, Journal of Crystal Growth, vol. 324, No. 1, Jun. 1, 2011 (Jun. 1. 2011), pp. 63-72, XP055013447, ISSN: 0022-0248.
A. Krost et al., Strain evaluation in AlInN/GaN Bragg mirrors by in situ curvature measurements and ex situ x-ray grazing incidence and transmission scattering, Applied Physics Letters, A I P Publishing LLC, US, vol. 97, No. 18, Nov. 3, 2010 (Nov. 3, 2010), pp. 181105-181105, XP012137485, ISSN: 0003-6951.
C. R. Miskys et al., GaN homoepitaxy by metalorganic chemical-vapor deposition on free-standing GaN substrates, Applied Physics Letters, A I P Publishing LLC, US, vol. 77, No. 12, Sep. 18, 2000 (Sep. 18, 2000), pp. 1858-1860.
G. Martinez-Criado et al., Free-standing GaN grown on epitaxial lateral overgrown GaN substrates, Journal of Crystal Growth, Elsevier, Amsterdam, NL, vol. 255, No. 3-4, Aug. 1, 2003 (Aug. 1, 2003), pp. 277-281, XP004434559, ISSN: 0022-0248, DOI: 10.1016/S0022-0248(03)01293-4.
Japanese Office Action dated Dec. 6, 2016 for corresponding application No. 2015-500920.
R. L. Headrick, Ion-assisted nucleation and growth of GaN on sapphire(0001), Physical Review B, vol. 58, No. 8, Aug. 8, 1998, pp. 4818-4824.
Chinese Office Action dated Apr. 25, 2016 for corresponding application No. 201380015539.8.
Non-Final U.S. Office Action dated Feb. 23, 2016 for U.S. Appl. No. 14/386,833, filed Sep. 22, 2014.
Napierala et al; Stress control in GaN/sapphire templates for the fabrication of crack-free thick layers; Journal of Crystal Growth 289 (2), 2006.
Richter et al; Hydride vapor phase epitaxy of GaN boules using high growth rates; Journal of Crystal Growth 312 (18), 2010.
Brunner et al; Growth optimization during III-nitride multiwafer MOVPE using real-time curvature, reflectance and true temperature measurements; Journal of Crystal Growth 298, 2007.
Richter et al; GaN boules grown by high HVPE; Physica Status Solidi; 2011.
Darakchieva et al; Lattice parameters of bulk GaN fabricated by halide vapor phase epitaxy; Journal of Crystal Growth; 310 (5), 2008.
Moram et al; X-Ray diffraction of III-nitrides; Reports on Progress in Physics; vol. 72; No. 3, 2009.
Hearne et al; Stress evolution during metalorganic chemical vapor deposition of GaN; Applied Physics Letters; vol. 74, No. 3; Jan. 18, 1999.
Ahmad et al; Dependence of the stress-temperature coefficient on dislocation density in epitaxial GaN grown on and 6H-SiC substrates; Journal of Applied Physics; 95 (4), 2004.
Shen et al; Calculated strain energy of hexagonal epitaxial thin films; Journal of Crystal Growth; vol. 240 (1-2), 2002.

(56) References Cited

OTHER PUBLICATIONS

Brunner et al, Quantitative analysis of in situ wafer bowing measurements for III-Nitride growth on sapphire; Journal of Crystal Growth; 310 (10), 2008.
Hertkorn et al; Process optimization for the effective reduction of threading dislocations in MOVPE grown GaN using in situ deposited SiNx masks; Journal of Crystal Growth, 310, 2008.
Tanaka et al; Anti-surfactant in III-nitride epitaxy quantum dot formation and dislocation termination; The Japan Society of Applied Physics; 39 (8B); Aug. 15, 2000.
Krost et al; In situ monitoring of the stress evolution in growing Group-III-Nitride layers; 275, 2005.
International Preliminary Report on Patentability dated Oct. 2, 2014 for corresponding PCT Application PCT/EP2013/055891, international filing date Mar. 21, 2013.
International Preliminary Report on Patentability dated Oct. 2, 2014 for corresponding PCT Application PCT/EP2013/055892, international filing date Mar. 21, 2013.
Non-Final U.S. Office Action dated Feb. 21, 2019 for U.S. Appl. No. 15/883,125, filed Jan. 30, 2018.
Chinese Office Action dated Aug. 27, 2019 for Chinese Application No. 201611230901.5 filed on Mar. 21, 2013.

\* cited by examiner

FIG. 1A  FIG. 1B
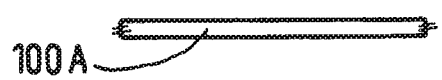
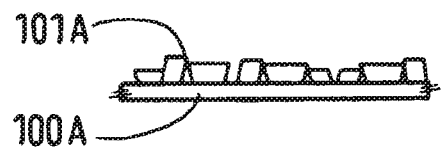
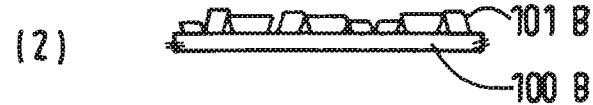
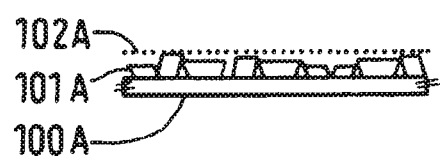
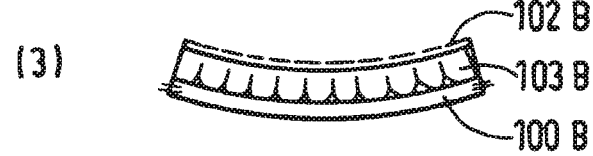
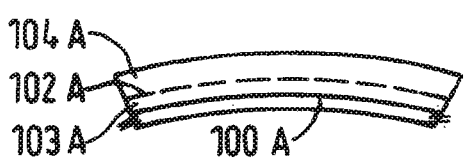
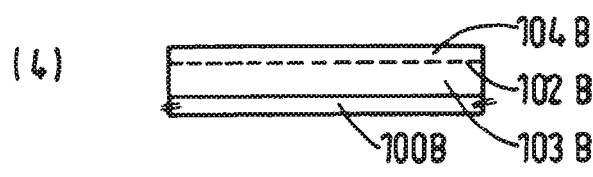
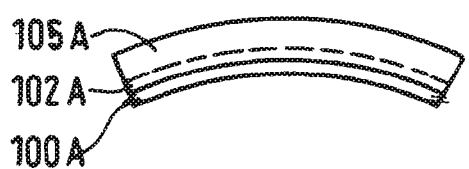
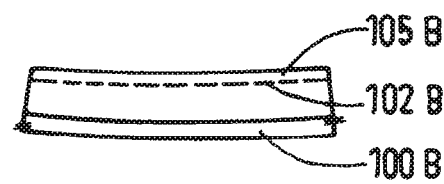
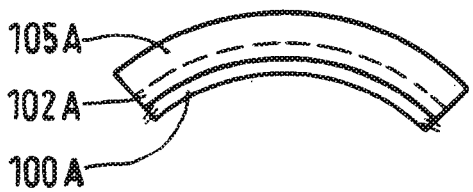
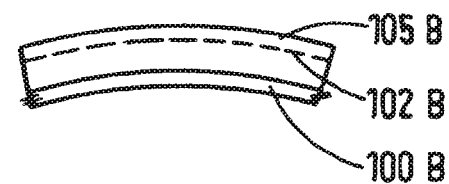

METHOD FOR PRODUCING III-N TEMPLATES AND THE REPROCESSING THEREOF AND III-N TEMPLATE

RELATED APPLICATIONS

The present application is Divisional Application of U.S. Ser. No. 14/386,845 filed on Sep. 22, 2014, now U.S. Pat. No. 10,309,037, which is a U.S. National Phase of PCT Application PCT/EP2013/055892, filed on Mar. 21, 2013, which claims the benefit under 35 U.S.C. § 119(a)-(d) of German patent application No. 10 2012 204 553.8 filed Mar. 21, 2012, and German patent application No. 10 2012 204 551.1 filed Mar. 21, 2012, and which claims the benefit under 35 U.S.C. § 119(e) of U.S. provisional application No. 61/614,161 filed Mar. 22, 2012, and U.S. provisional application 61/614,190 filed Mar. 22, 2012. The contents and disclosures of these prior applications are incorporated herein by reference in their entirety.

FIELD OF THE INVENTION

The present invention relates to processes for producing composite substrates (called "template(s)" in the following) and for producing III-N single crystals. The processes according to the present invention allow to produce crack-free III-N single crystals which are in particular suitable for use as wafers. III denotes at least one element of the main group III of the periodic table of the elements, selected from the group of Al, Ga and In.

BACKGROUND

III-N single crystals are of great technical importance. A multitude of semiconductor devices and optoelectronic devices such as power components, high-frequency components, light-emitting diodes and lasers are based on these materials. Epitaxial crystal growth on a starting substrate is frequently carried out when producing such devices, or a template is initially formed on a starting substrate, onto which III-N layers or respectively III-N boules can be subsequently deposited by further epitaxial growth. III-N substrates or in particular foreign substrates can be used as starting substrates. When using foreign substrates, stresses and cracks within a III-N layer can occur during the growth due to the differences between the thermal expansion coefficients of starting substrate and epitaxial layer. Thicker layers can also be grown with the aid of partially structured interlayers composed of WSiN, TiN or $SiO_2$ and deposited in an external process, wherein said thicker layers can be subsequently separated as free-standing layers which typically have plastic, concavely bent c lattice planes and surfaces. At or above the interface between starting substrate and epitaxial III-N layer vertical and horizontal microcracks can form, which can expand over time and which can lead to breaking of the GaN layer during or after the cooling process.

From investigations by Hearne et al., Applied Physics Letters 74, 356-358 (1999) it is known that during the deposition of GaN on a sapphire substrate an intrinsic tensile stress builds up which increases with the growth. An in situ stress monitoring showed that the tensile stress produced by the growth cannot be measurably relaxed by annealing or thermal cycling. This means inter alia that a stress obtained at the end of the growth of the GaN layer will have the same value again after cooling and reheating to the same (growth) temperature. In Hearne et al. also an explanation of the background, relationships and possibilities for observation of extrinsic (namely generated by different thermal expansion coefficients between sapphire substrate and GaN layer) and intrinsic (namely generated by growth) stress is given.

In order to counter-act the generation of stress, namely of tensile stress, in multilayer structures of III-N layers on foreign substrates with increasing growth of the III-N layer structures in US 2008/0217645 A1 the following measures are undertaken: firstly on a nucleation layer a AlGaN gradient layer is deposited, and secondly relaxed GaAl(In)N interlayers are provided in between nitride layers. Furthermore, when after several epitaxial layers the dislocation density increases excessively in the epitaxial layer structure, in US 2008/0217645 A1 mask layers with for example SiN, MgN and/or BN mask material are used to reduce the dislocation density. Also in further examples and other connections the influence of mask layers on the change of the dislocation density is described, for example in Tanaka et al., Jpn. J. Appl. Phys. Vol. 39, L831-L834 (2000) (in particular with regard to the use of a SiC foreign substrate), in WO2012035135A1 (in particular with regard to the use of a Si foreign substrate) as well as in the publication by Hertkorn et al. (2008) further discussed below.

Napierala et al. in Journal of Crystal Growth 289, 445-449 (2006) describe a process for producing GaN/sapphire templates onto which crack-free thin GaN layers are grown by being able to control the intrinsic stress in the gallium nitride through the setting of the density of gallium nitride crystallites in such a way that stresses in the thin layers can be released by bending. In this process, however, thick layers cannot compensate the pressure during the growth and tend to breaking despite the bending. Richter et al. (E. Richter, U. Zeimer, S. Hagedorn, M. Wagner, F. Brunner, M. Weyers, G. Tränkle, Journal of Crystal Growth 312, [2010] 2537) describe a process for producing GaN crystals via Hydride Vapor Phase Epitaxy (HVPE) in which GaN layers having a thickness of 2.6 mm can be grown in a crack-free manner by setting the partial pressure of gallium chloride, wherein the obtained GaN layers exhibit a multitude of V-pits on the surface. A crystal grown with this process has a thickness of 5.8 mm, it however exhibits longer cracks. Brunner et al. in Journal of Crystal Growth 298, 202-206 (2007) show the influence of the layer thickness on the curvature of the epitaxial III-N layer. The growth of GaN and AlGaN, optionally with InGaN compliance layer, on GaN-sapphire template is investigated. It was found that the concave curvature increases during the growth for GaN and AlGaN with 2.8% and 7.6% of Al mole fraction. Furthermore, the concave curvature increases with rising aluminium content. In addition, the influence of a Si-doped indium gallium nitride layer on the growth of an AlGaN layer with 7.6% of Al mole fraction on a GaN buffer layer is shown. For this purpose on the one hand an AlGaN layer with 7.6% of Al mole fraction is directly grown onto a GaN buffer layer, and on the other hand a Si-doped indium gallium nitride layer as interlayer is grown onto a GaN buffer layer, wherein subsequently an AlGaN layer with 7.6% of Al mole fraction is grown onto the interlayer. It was thus shown that the deposition of a Si-doped indium gallium nitride layer onto a GaN buffer layer leads to compressive stress in the crystal. During this process the initially concave curvature of the GaN buffer layer is transformed into a slightly convex curvature in the course of a temperature reduction, and this convex curvature increases during the further growth by epitaxially growing an $In_{0.06}Ga_{0.94}N$ layer within the same process. During the subsequent deposition of an $Al_{0.076}Ga_{0.924}N$ layer onto this $In_{0.06}Ga_{0.94}N$ layer a concave curvature is eventually obtained, which is comparatively lower than the resulting curvature without $In_{0.06}Ga_{0.94}N$ interlayer.

E. Richter, M. Grüinder, B. Schineller, F. Brunner, U. Zeimer, C. Netzel, M. Weyers and G. Trankle (Phys. Status Solidi C 8, No. 5 (2011) 1450) describe a process for producing GaN crystals via HVPE, wherein a thickness of up to 6.3 mm can be reached. These crystals exhibit slanted sidewalls and V-pits on the surface. Moreover, the crystal lattice has a concave curvature of approximately 5.4 m and a dislocation density of $6\times10^5$ $cm^{-2}$.

Hertkorn et al. in J. Cryst. Growth 310 (2008), 4867-4870 describe process conditions for forming 2-3 μm thin GaN layers via Metal-Organic Vapor Phase Epitaxy (MOVPE) using $SiN_x$ masks deposited in situ. The relationship with a possible influence on defects or respectively the development of the dislocation density is investigated with respect to different locations or respectively positions of the $SiN_x$ masks, specifically at 0 (i.e. directly on an AlN nucleation layer) or after the growing of 15, 50, 100, 350 and 1000 nm. As a result it is speculated that a defect termination or respectively a decrease of the dislocation density is most effective when the $SiN_x$ is positioned after the growth of 100 nm of GaN. On the other hand, it is being stressed as negative and problematic that the deposition of $SiN_x$ directly on or in the vicinity of the AlN nucleation layer produced strongly compressively stressed GaN layers and led to layer deformity—so-called stacking faults, which were visible in the transmission electron microscope and which were further accompanied by a broadening of the $D^0X$ line width and the X-ray peaks. Therefore, for avoiding such problems, a second $SiN_x$ mask was deposited after 1.5 μm for the screening of the defects. Apart from a reduction of the dislocation density, which however was also described as being associated with disadvantageous effects, the authors did not recognize which parameters being important for the further processing of templates can be influenced in which way by a deposition of $SiN_x$, and especially if and how a later tendency towards crack formation during the growth of further III-N layers and III-N bulk crystals can be suppressed.

DE 102006008929 A1 describes a nitride semiconductor device based on a silicon substrate and the production thereof, including the deposition of an aluminium-containing nitride nucleation layer on the silicon substrate. A process is described which is based specifically on the use of a silicon substrate, wherein it is observed that the growth of semiconductor layers on sapphire substrates is subject to completely different boundary conditions compared to the growth on a silicon substrate. In fact as a result after cooling to room temperature the III-N layer grown according to the system of DE 102006008929 A1 is not compressively, not even nearly compressively stressed, but merely less tensily stressed compared to a conventional III-N layer grown on a silicon substrate.

US 2009/0092815 A1 describes the production of aluminium nitride crystals having a thickness between 1 and 2 mm as well as aluminium nitride layers having a thickness of 5 mm. These layers are described as crack-free and can be used to cut colourless and optically transparent wafers having a usable area of more than 90% for the application in the production of devices and components.

The processes in the above-described prior art have in common that after growth and cooling-down III-N crystals are obtained which are subjected to strong extrinsic and intrinsic stress, whereby cracks or other material defects can develop, which limit the material quality and the processability towards III-N substrates.

SUMMARY OF THE INVENTION

The object of the present invention is to provide production processes for templates and III-N crystals that enable growth of III-N crystals under conditions which minimize the inclusion of material defects and improve the crystal quality as well as the processability.

The object is solved by processes provided hereinbelow. Furthermore, the present invention provides hereinbelow new templates. Beneficial uses are defined hereinbelow.

According to the present invention in a template (i.e. a unit with a foreign substrate comprising sapphire and a relatively thin III-N crystal layer, wherein such a template-unit on its part serves as starting product for the subsequent production of III-N crystal boules/ingots or of III-N devices) the correct influence of the critical parameters curvature and stress of the template were respectively alternatively recognized as particularly important for advantageous properties of the template and its further processing. It was surprisingly found that these parameters can be very favourably influenced by carefully selected factors, which in particular include the provision and the layered deposition of a mask material according to position or respectively layer location in the template, whereby especially a later crack formation using the template according to the present invention can be efficiently counter-acted. According to alternative technical solutions, for settings relevant to the present invention and favourable for the further processing of the template it has to be made sure that (i) a curvature difference ($K_s$–$K_e$) to be further specified later is held in the range of ≥0 and in particular >0 during at least one growth phase during the template production, or (ii) the produced template in the status at growth temperature is essentially not bowed or is negatively (convexly) bowed. According to the present invention templates can be produced which under epitaxial crystal growth conditions exhibit no or almost no curvature or a negative curvature and thus only a slight intrinsic stress which proved to be advantageous as starting situation for the further processing. As is experimentally shown according to the invention it is possible that the above-mentioned technical solutions (i) and (ii) can advantageously be realized without the inclusion of dopants into the III-N layer of the template, i.e. that apart from the components for the mask material interlayer no foreign components are provided in the template ("foreign" in the sense of other than the III and N components of the III-N layer). Since according to the invention it can be paid attention to that the formation of the III-N layer of the template is carried out in situ with the formation of the mask material interlayer, furthermore the above-mentioned technical solutions (i) and (ii) can be realized independently from surface structurings of the provided sapphire substrate; the latter applies namely to conventional patternings carried out ex situ, such as for example the opening of windows, the formation of stripes or dots and other mask structures, for example by (photo) lithography, thus conventional cases in which the desirable curvature behaviour cannot be set as according to the invention.

In the case of thus optionally provided surface structurings of the sapphire substrate itself which optionally can exhibit mask patterns according to the invention it is furthermore paid attention to that additionally mask material as interlayer is deposited at least in part directly on the sapphire substrate or on the optionally present III-N nucleation layer thereon (i.e. immediately adjacent), or in the crystalline III-N material of the template at a suitable distance to the main surface of the sapphire substrate or the optionally present III-N nucleation layer thereon (i.e. insofar a contact with substrate or respectively III-N nucleation layer occurs), even when optionally such surface structurings on the sapphire substrate are provided. Furthermore, the dimensions are different: surface maskings and patterning performed ex situ typically exhibit a thickness dimension in the μm range, whereas the according to the invention relevant in situ mask material interlayer typically exhibits a thickness dimension in the sub-μm range.

According to the invention it is possible to quantitatively set a stress purposively and if desired in a specific stress value which is favourable for the further processing; in particular according to the invention a template can turn to a stress-free, optionally even compressively stressed range. In a preferred embodiment this can be accomplished solely by the suitable provision of a mask material interlayer as described here.

Accordingly, the process according to the present invention and more significantly the observation of the preferred features of the process according to the present invention allow an advantageous setting of the strain in the III-N crystal layer of the template with an $\varepsilon_{XX}$ value at room temperature (alternatively, or also additionally, at a growth temperature) of $\varepsilon_{XX} \leq 0$ and in particular of $\varepsilon_{XX} < 0$, and furthermore in addition of particularly suitable negative $\varepsilon_{XX}$ values, which has a very favourable effect on the further processing of the template according to the present invention and which thus constitutes an alternative relevant product feature of the template according to the present invention.

Conventional and commonly performed pertinent processes so far have shown a different behaviour or have not revealed the useful relationships recognized here. Due to different thermal expansion coefficients of foreign substrate and III-N layer as well as further factors, in conventional processes using for example the standard substrate sapphire at growth temperature typically a concave curvature of the growth surface is formed, which then in the course of the further crystal growth, i.e. with increasing thickness of the III-N layer, increases further. Surprisingly, the process according to the present invention can be arranged such that during a particular growth phase of the III-N material layer of the template a given curvature markedly decreases despite the further growth of the III-N material layer.

Furthermore, as a result of a continuously increasing curvature in conventional processes a corresponding increasing intrinsic—typically tensile—stress within the crystal is built up, which optionally already during the further growth and in particular during further use or respectively further processing of the template, at the latest during the cooling-down from the epitaxial growth temperature, can readily lead to micro-cracks and even to breaking. By contrast, in the process according to the present invention an intrinsic—typically compressive—stress, set in a controlled manner, can be purposively controlled during the epitaxial crystal growth, or a curvature can be set at zero or almost at zero such that during the subsequent growth of III-N crystals, for example for the formation of III-N bulk crystals—optionally during a continued growth without interruption of the growth, or within a separate growth process with interruption—, and even still during the final cooling cracks can be avoided.

In such a III-N crystal it is further avoided that cracks develop, which limit the material quality and/or the processability to III-N substrates. "Crack-free III-N crystal" according to the present invention denotes that it exhibits no crack on an area of 15 cm² at inspection of respectively 30 mm² image sections with an optical microscope.

According to the present invention furthermore the microscopic property of the deformation (strain) $\varepsilon_{XX}$ of the lattice constant a can be influenced. In mechanics the deformation $\varepsilon$ is generally also referred to as strain tensor, wherein $\varepsilon_{XX}$ denotes its first component For crystal lattices the strain $\varepsilon_{XX}$ is defined as follows:

$$\varepsilon_{XX} = \frac{\text{lattice constant } a - \text{lattice constant } a_0}{\text{lattice constant } a_0}$$

wherein a is the actual lattice constant in the crystal and $a_0$ presents the theoretical ideal lattice constant, wherein for $a_0$ typically a literature value of $a_0 = 3.18926 \pm 0.00004$ Å (according to V. Darakchieva, B. Monemar, A. Usui, M. Saenger, M. Schubert, Journal of Crystal Growth 310 (2008) 959-965) is assumed.

Accordingly, the actually present crystal lattice constants can be influenced by epitaxial growth of crystal layers under extrinsic stress. For example, a compressive stress can be transferred or imposed to the growing crystal by extrinsic stress, whereby compared to growth without stress lattice constants are contracted. Thereby intrinsic stress is built up within the crystal in a controlled and purposive manner, wherein said stress favourably influences the above-mentioned properties of deformation and stress.

According to the present invention it is preferred that III-N crystals of templates according to the present invention have an $\varepsilon_{XX}$ value of $\leq 0$, more preferred of $<0$. Such templates are excellently suited as starting products for growing further epitaxial layers of the III-N system, in particular for producing thick III-N layers and III-N boules (bulk crystals).

Without limiting the invention, in the following a compilation of items is given, which describe aspects, further embodiments and particular features of the present invention:

1. A process for producing a template comprising a substrate and at least one III-N crystal layer, wherein III denotes at least one element of the main group III of the periodic table of the elements, selected from Al, Ga and In, the process comprising the steps of providing a substrate and growth of a crystalline III-N material on the substrate, wherein a mask material is deposited as interlayer on the substrate, which optionally comprises a III-N nucleation layer, or in the crystalline III-N material at a distance from the substrate or from the optionally provided III-N nucleation layer, and subsequently the growth of a crystalline III-N material is carried out or continued, wherein a possible distance of the interlayer of the mask material to the substrate or respectively the nucleation layer optionally formed thereon is at most 300 nm, and wherein, when during the crystal growth the curvature of the growth surface of the III-N crystal at a first, relatively earlier time point is denoted as $K_s$ and at a second, relatively later time point is denoted as $K_e$, a curvature difference $(K_s - K_e)$ of $\geq 0$ is provided for.

The range of $K_s - K_e > 0$ is preferred.

The substrate is formed as foreign substrate, i.e. it is a material different from the III-N material of the template, in particular the foreign substrate comprises sapphire or it consists of sapphire.

The mask material is suitably defined as a material which is different from the substrate material and III-N material and on which the III-N growth is inhibited, disturbed or prevented. Examples for the mask material are further described below.

The terms "relatively early" and "relatively late" denote a first or respectively a second time point during the crystal growth, which respectively can be the beginning and the end of the entire crystal growth of the III-N crystal layer, but which can also only define a particular phase of the entire crystal growth of the III-N crystal layer, wherein in the latter case it does not matter how the curvature behaviour is before the first or respectively after the second time point. For example, but without being limited thereto, the relatively early first time point is given by the time point of coating of the interlayer of the mask material, and for example the relatively late second time point is given by the end of the production stage of the template, again without being limited thereto. The possible variants of the respective time points have in common that they respectively favourably influence strain/stress in the formed III-N crystal and/or the curvature behaviour or respectively curvature status of the template at the growth temperature and/or at room temperature, respectively in comparison to the non-observance of the specified relationship of $K_s-K_e$.

The term "interlayer" is to be understood in broad sense, generally as a material layer comprising mask material, optionally comprising besides mask material also further material such as the III-N material, or exhibiting material-free gaps. The thickness of the "interlayer" is variable, but generally is thin to very thin, suitably in the nanometer range (e.g. up to a maximum of 50 nm, preferably below 5 nm) or in the sub-nanometer range (e.g. up to below 1 nm, in particular up to below one monolayer, i.e. 0.2 to 0.3 nm or less).

Depositing of the mask material of the interlayer "on the substrate" means directly adjacent to a surface of the sapphire or the optional III-N nucleation layer above the sapphire, and "at a distance from the substrate" denotes the distance of the location/position of the mask material interlayer from this surface.

2. The process according to item 1, characterized in that the curvature difference ($K_s-K_e$) is at least 5 km$^{-1}$, preferably at least 10 km$^{-1}$, more preferably at least 20 km$^{-1}$ and in particular at least 50 km$^{-1}$.

3. The process according to item 1 or 2, wherein the template is further used for coating one or multiple further III-N crystal layer(s), optionally for producing a III-N bulk crystal.

Since according to the present invention the produced template is favourably influenced by observing the curvature difference $K_s-K_e$ the further curvature behaviour of the growth surface of the III-N crystal is not specified during an optionally subsequent coating or respectively epitaxial growing of further semiconductor material.

4. A process for producing III-N single crystal, wherein III denotes at least one element of the main group III of the periodic table of the elements, selected from Al, Ga and In, wherein the process comprises the following steps:

aa) providing a template which comprises a foreign substrate comprising sapphire and a III-N crystal layer, wherein the template in a growth temperature range is not or is essentially not bowed or is negatively bowed, wherein in the provided template in the region above the foreign substrate or in the III-N crystal layer of the template a mask material is deposited as interlayer such that no distance is set or that a distance of the interlayer of the mask material to the substrate or respectively the III-N nucleation layer optionally formed thereon is at most 300 nm;

bb) carrying out an epitaxial crystal growth for the formation of further III-N crystal on the template according to aa), optionally for producing III-N bulk crystal, cc) optionally separating III-N single crystal or III-N bulk crystal and foreign substrate.

According to the invention it is preferred that the desired favourable non-curvature or (compressive or convex) negative curvature of the template was set during its heating in the initial condition, i.e. before the further growth according to step bb) occurs, by purposively positioning an interlayer of the mask material in a defined and limited height level on/above the foreign substrate. In this respect and for the term "interlayer" see the above items 1 and 2. If this measure is not or not individually sufficient for the specified condition, additional further parameters can be observed and set, for example in that a variation of the growth temperature (decrease based on the choice of sapphire as foreign substrate) occurred during a limited phase of the growth of the III-N layer of the template and thus a supplemental and/or alternative contribution to the relationship $K_s-K_e \geq 0$ was provided.

The term "growth temperature" relates to a temperature at which a deposition, in particular an epitaxial growth, of a desired III-N crystal is enabled.

5. The process according to one of the preceding items, characterized in that when for the template as foreign substrate sapphire with a thickness ($d_{sapphire}$) of approximately 430 µm (i.e. ±20 µm) and as III-N crystal layer GaN with a thickness ($d_{GaN}$) of approximately 7 µm (i.e. ±0.5 m) is used or set, at the III-N crystal a curvature of the template ($K_T$) at the growth surface (i) at growth temperature is specified in the range from 0 to −150 km$^{-1}$, preferably in the range from −25 to −75 km$^{-1}$, and/or (ii) at room temperature is specified in the range of <−200 km$^{-1}$, preferably from −200 to −400 km$^{-1}$, more preferably in the range from −300 to −350 km$^{-1}$;

wherein when using or setting different layer thicknesses ($d_{sapphire}/d_{GaN}$) the curvature value lies depending on the respective layer thicknesses analogous to the Stoney equation in the following range:

$$K_{T(dGaN;dsapphire)} = K_{T(7\mu m;430\mu m)} \times (430\ \mu m/d_{sapphire})^2 \times (d_{GaN}/7\ \mu m).$$

6. The process according to one of the preceding items, characterized in that the III-N single crystal of the template exhibits a curvature radius in the range from −2 to −6 m at room temperature.

7. The process according to one of the preceding items, characterized in that in the crystalline III-N material a compressive stress is created.

The compressive stress is created primarily by depositing the interlayer of the mask material without distance or respectively at a purposively specified distance from the sapphire substrate or respectively from the nucleation layer.

8. The process according to one of the preceding items, characterized in that the III-N single crystal of the template exhibits a compressive stress of $\sigma_{xx}<-0.70$ GPa at room temperature.

9. The process according to one of the preceding items, characterized in that an interlayer of the mask material is deposited at a maximum distance from the foreign substrate of below 300 nm, preferably below 250 nm, more preferably below 100 nm, more preferably up to a maximum of 50 nm.

10. The process according to one of the preceding items, characterized in that the interlayer of the mask material is deposited on a III-N nucleation layer on the foreign substrate and subsequently the growth of the III-N crystal is carried out.

In this embodiment, it is preferred that the interlayer of the mask material is deposited directly and immediately on the III-N nucleation layer of the foreign substrate, still before the coalescence is finished and thereafter the actual growth of the III-N single crystal of the template starts.

11. The process according to one of the preceding items, characterized in that the mask material is deposited in situ during the production of the template on the foreign substrate or within the III-N layer of the template in the same reactor, and/or immediately after the deposition of the mask material the III-N growth process is continued.

12. The process according to one of the preceding items, characterized in that the mask material in the template is homogeneously distributed in a plane, but preferably is discontinuously deposited. Although according to this possible embodiment, the mask material in the template is present essentially in a plane, the form of the deposition can be different. The layer of the mask material can form a complete layer, however alternatively and preferably it exhibits disruptions and is discontinuously distributed in a layer; in particular, it can be present in the form of network structures and/or in the form of nano-platelets or nano-islands of the mask material (nano-mask with mask material), wherein out of microscopic or nano-dimensioned gaps in the discontinuous mask layer the subsequent growth of the III-N layer can follow. The thickness of the layer of the mask material is also variable. The different possible deposition forms have in common a respectively favorable influence on strain/stress in the formed III-N crystal and/or on the curvature behaviour or respectively status of the template at growth temperature and/or at room temperature. Desired forms can be suitably set by appropriate parameters, for example by flow rates of the corresponding starting materials, by the reactor pressure, by the deposition temperature or by the duration of the deposition of the mask material.

13. The process according to one of the preceding items, characterized in that no second $SiN_x$ mask at a distance of 1.5 µm is deposited, or that a second $SiN_x$ mask is deposited not at all.

14. The process according to one of the preceding items, characterized in that in the template only a single layer of the mask material is deposited.

15. The process according to one of the preceding items, characterized in that the mask material is a material, on which a III-N deposition is inhibited or prevented.

16. The process according to the preceding item, wherein the mask material is selected from the group consisting of $Si_xN_y$ (wherein x and y respectively independently from each other denote positive numbers which lead to stoichiometric or nonstoichiometric SiN compounds; in particular $Si_3N_4$), TiN, $Al_xO_y$ (wherein x and y respectively independently from each other denote positive numbers which lead to stoichiometric or nonstoichiometric AlO compounds; in particular $Al_2O_3$), $Si_xO_y$ (wherein x and y respectively independently from each other denote positive numbers which lead to stoichiometric or nonstoichiometric SiO compounds; in particular $SiO_2$), WSi, and WSiN.

In the deposition of the mask material the mask material is preferably deposited directly in the reactor in situ from corresponding reactive species of the respective elements from the gas phase, and preferably directly thereafter the deposition of the actual III-N crystal of the template is started or respectively continued.

17. The process according to one of the preceding items, characterized in that the foreign substrate consists of sapphire.

18. The process according to one of the preceding items, characterized in that the curvature of the III-N crystal of the template is additionally changed in at least one growth phase by varying the growth temperature.

19. The process according to one of the preceding items, characterized in that in at least one deposition phase of the III-N crystal of the template the growth occurs at a lowered growth temperature compared to that of a preceding III-N deposition.

20. The process according to item 19, characterized in that the temperature decrease is at least 10° C., preferably is at least 20° C., preferably lies in the range from 20 to 50° C., more preferably lies in the range from 25 to 40° C. and particularly preferably is at 30° C.

21. The process according to one of the preceding items, characterized in that the provided substrate has a polished surface.

22. The process according to one of the preceding items, characterized in that the provided substrate exhibits a surface structured by lithography or wet chemical etching or dry chemical etching (e.g. ICP).

23. The process according to one of the preceding items, characterized in that on the template or on the thereon epitaxially grown III-N crystal at least one and optionally further GaN, AlN, AlGaN, InN, InGaN, AlInN or AlInGaN layer(s) for producing corresponding further III-N layers or III-N crystals is (are) deposited.

24. The process according to one of the preceding items, characterized in that the III-N crystal layer of the template as well as the thereon epitaxially grown III-N crystal are composed of the same III-N material.

25. The process according to one of the preceding items, characterized in that the III-N crystal layer on the foreign substrate as well as the thereon epitaxially grown III-N crystal respectively form a binary system.

26. The process according to one of the preceding items, wherein after deposition of the interlayer of the mask material in situ additional crystal growth for the formation of III-N crystal with a total thickness in the range from 0.1 to 10 µm occurs, preferably with a thickness in the range from 3 to 10 µm, wherein a template is obtained, wherein the total thickness of the III-N layer of the template is calculated including the interlayer of the mask material.

27. The process according to one of the preceding items, characterized in that MOVPE is used as growth method.

28. The process according to one of the preceding items, characterized in that on the template III-N single crystals are grown with layer thicknesses of at least 1 mm, preferably of at least 5 mm, more preferably of at least 7 mm and most preferably of at least 1 cm.

29. The process according to one of the preceding items, characterized in that the crystal growth at least in the step after finishing the template formation, optionally from the beginning and in all crystal growth steps, is carried out via HVPE.

30. A process for producing a III-N single crystal according to one of the preceding items, characterized in that after finishing the crystal growth the grown III-N single crystal and the foreign substrate comprising are separated from each other by self-separation, preferably during cooling from a crystal growth temperature.

31. A process for producing III-N single crystal according to one of the preceding items, characterized in that after finishing the crystal growth the grown III-N single crystal and the foreign substrate comprising sapphire are separated from each other by grinding-off, sawing-off or a lift-off process.

32. A process for producing III-N crystal wafers, wherein III denotes at least one element of the main group III of the periodic table of the elements, selected from the group of Al, Ga and In, wherein the process comprises the following steps:

a) carrying out a process according to one of the items 3 to 31 for forming a III-N bulk crystal, and b) individualizing the bulk crystal for forming wafers.

33. A template with a substrate comprising sapphire and at least one III-N crystal layer, wherein III denotes at least one element of the main group III of the periodic table of the elements, selected from the group of Al, Ga and In, wherein in the region above the foreign substrate or in the III-N crystal layer of the template a mask material is provided as interlayer, wherein in the III-N crystal layer of the template a value $\varepsilon_{xx}$ at room temperature of $\varepsilon_{xx} < 0$ is set.

34. A template with a substrate comprising sapphire and at least one III-N crystal layer, wherein III denotes at least one element of the main group III of the periodic table of the elements, selected from the group of Al, Ga and In, wherein in the region above the foreign substrate or in the III-N crystal layer of the template a mask material is provided as interlayer, wherein in the III-N crystal layer of the template a value $\varepsilon_{xx}$ at growth temperature of $\varepsilon_{xx} \leq 0$ is set.

35. The template according to item 33 or 34, wherein in the III-N crystal layer of the template the value $\varepsilon_{xx}$ at room temperature is set in the range of $0 > \varepsilon_{xx} \geq -0.003$ and in particular in the range of $-0.0015 > \varepsilon_{xx} \geq -0.0025$ and in particular in the range of $-0.0020 \geq \varepsilon_{xx} \geq -0.0025$.

36. The template according to one of the items 33 to 35, wherein in the III-N crystal layer of the template the $\varepsilon_{xx}$ value at growth temperature lies in the range of $0 > \varepsilon_{xx} > -0.0006$, preferably in the range of $-0.0003 > \varepsilon_{xx} > -0.0006$.

37. The template according to one of the items 33 to 36 in the form of a template with a layer thickness of the III-N single crystal in the range from 0.1 to 10 μm, preferably from 2 to 5 μm, calculated including the interlayer of the mask material.

38. The template according to one of the items 33 to 37, characterized in that the III-N single crystal at room temperature exhibits a compressive stress of $\sigma_{xx} < -0.70$ GPa.

39. The template according to one of the items 33 to 38, characterized in that when for the template as foreign substrate sapphire with a thickness ($d_{sapphire}$) of approximately 430 μm (i.e. ±20 μm) and as III-N crystal layer GaN with a thickness ($d_{GaN}$) of approximately 7 μm (i.e. ±0.5 m) is used or set, at the III-N crystal a curvature of the template ($K_T$)

(i) at growth temperature is specified in the range from 0 to $-150$ km$^{-1}$, preferably in the range from $-25$ to $-75$ km$^{-1}$; and/or (ii) at room temperature is specified in the range from $-200$ to $-400$ km$^{-1}$, preferably in the range from $-300$ to $-400$ km$^{-1}$, more preferably in the range from $-300$ to $-350$ km$^{-1}$, wherein when using or setting different layer thicknesses ($d_{sapphire}/d_{GaN}$) the curvature value lies depending on the respective layer thicknesses analogous to the Stoney equation in the following range:

$$K_{T(dGaN;dsapphire)} = K_{T(7\mu m;430\mu m)} \times (430 \ \mu m/d_{sapphire})^2 \times (d_{GaN}/7 \ \mu m).$$

40. The template according to one of the items 33 to 39, characterized in that III denotes Ga and the crystal in growth direction exhibits a lattice constant in the range from 0.31829 nm < a < 0.318926 nm.

41. The template according to one of the items 33 to 40, characterized in that the substrate comprising sapphire is removed.

42. The template according to one of the items 33 to 41, produced according to or used in one of the processes according to items 1 to 32.

43. Use of III-N wafers produced according to item 32, or use of a template according to one of the items 33 to 42 for producing thicker III-N layers or III-N crystal boules or respectively bulk crystals, which optionally thereafter are separated into individual III-N wafers.

44. Use of III-N wafers produced according to item 32, or use of a template according to one of the items 33 to 42, respectively for producing semiconductor devices, electronic or optoelectronic devices.

45. The use according to item 44 for producing power components, high-frequency components, light-emitting diodes and lasers.

46. Use of a mask material as interlayer in a template, which has a substrate comprising sapphire and a III-N crystal layer, wherein III denotes at least one element of the main group III of the periodic table of the elements, selected from the group of Al, Ga and In, for controlling a curvature value and/or a stress of the template to deposit at least one further III-N crystal layer on the substrate after setting a particular curvature value and/or a particular stress.

47. The use according to item 46, wherein the particular curvature value and/or the particular stress avoids a crack formation in a subsequent further growth of an additional III-N layer.

The presently denoted temperatures relate to, unless otherwise specified, the corresponding temperatures set at heating devices, i.e. nominally set temperatures for respective steps (process temperature). The temperatures at the template/wafer typically lie slightly lower, which can be different depending on the reactor type; for example up to 75K lower. For the reactor type used in the Examples the temperatures at the template/wafer lie about 30 to 50K below the process temperature (measured with an in situ measurement device EpiTT of the company Laytec, Berlin, Germany).

BRIEF DESCRIPTION OF THE FIGURES

FIGS. 1A and 1B schematically show stages of the growth process for forming III-N templates with sapphire substrate, and in respectively different embodiments according to the present invention;

Figure 2:
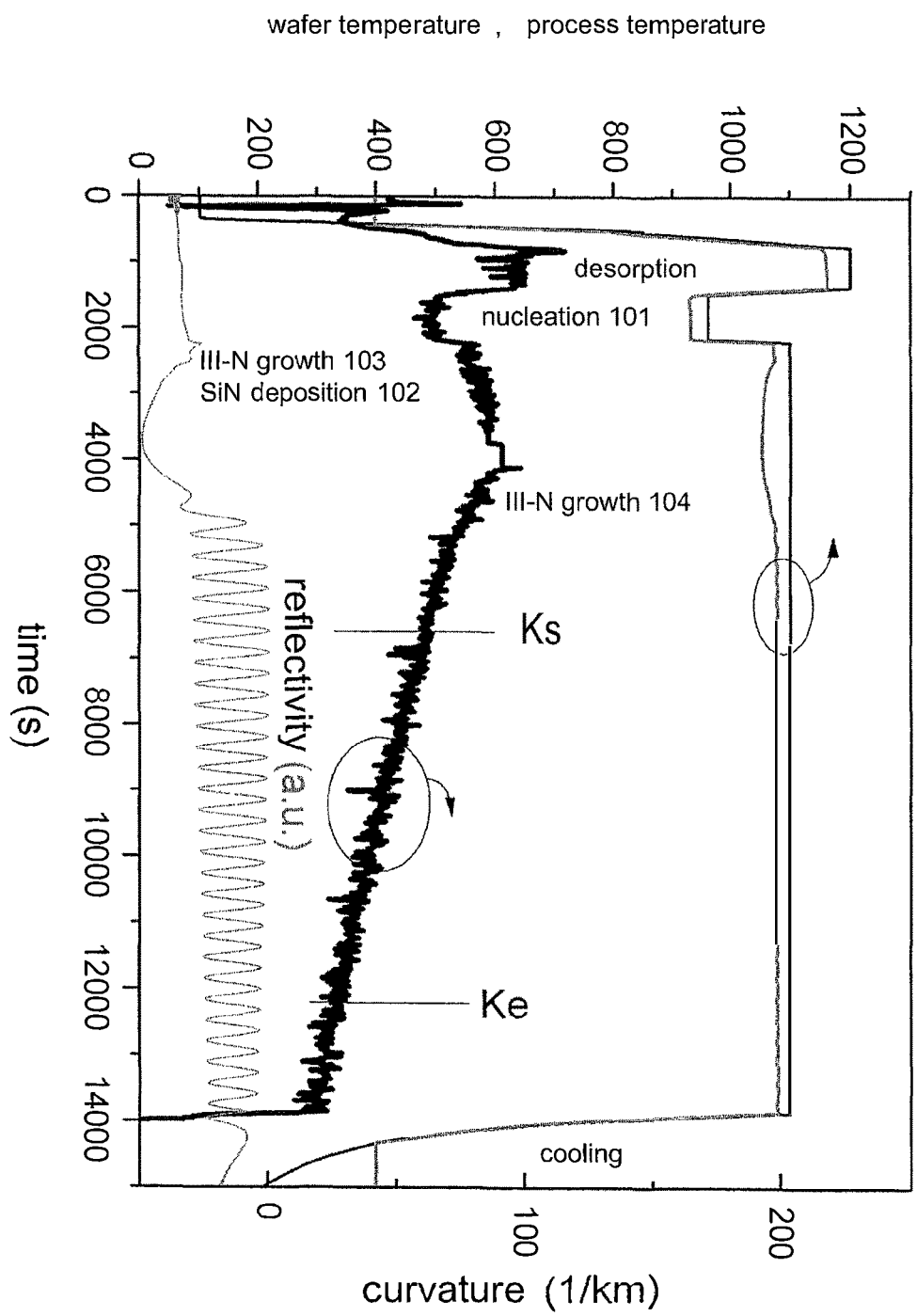
FIG. 2 illustrates temporal temperature, reflection and curvature profiles during the exemplary growth of GaN on sapphire (distance 15 nm)

Without thus limiting the present invention, the following detailed description of the figures, aspects, embodiments and particular features will illustrate the invention and describe particular embodiments in detail.

DETAILED DESCRIPTION

In the process for producing III-N starting substrates it was surprisingly found that by appropriately positioning a interlayer of mask material the templates can be significantly favourably influenced with respect to the relevant parameters of curvature of the growth surface at the template and/or suitable stress in the template such that the subsequent growth of III-N single crystals with excellent properties is enabled and in particular the subsequent tendency to crack formation in III-N single crystals growing on the template is significantly reduced.

For producing the template initially a substrate is provided which is selected from starting substrates comprising sapphire or respectively consisting of sapphire as well as such starting substrates with structures formed thereon, for example with specific externally (ex situ) formed mask structures. A further possibility of providing a suitable starting substrate can comprise the formation of interlayers or intermediate structures for the purpose of supporting the later separation from the starting substrate, and/or the formation of a so-called GaN "nano grass" which is based on a substrate having formed thereon a GaN compliance layer with nano-column structure, as for example described in WO 2006035212 A1, WO 2008096168 A1, WO 2008087452 A1, EP 2136390 A2 and WO 2007107757 A2.

A patterning optionally carried out ex situ, such as for example the opening of windows and other mask structures, thus belongs at the most to the step of providing the starting substrate, however not to the actual step of inserting the mask interlayer, as is described in the following in connection with the process according to the invention.

For the provision of a starting substrate a foreign substrate with sapphire is used, preferably it consists of sapphire. More preferably a sapphire substrate with c orientation is used having a tilt towards (1-100) or (11-20) by 0.1 to 0.5° and a one-sided epi-ready polishing and a polished and/or preferably lapped backside. A further embodiment provides for the starting substrate to exhibit a surface structured by lithography or wet chemical or dry chemical etching processes (e.g. ICP etching).

Based on the schematic FIGS. 1A and 1B, exemplary, non-limiting, however respectively varied embodiments are described. At this point it is noted that the thickness of a substrate (reference signs 100A and 100B, respectively) is substantially larger than the thicknesses of III-N material and III-N layers which are formed thereon, and further that a main part of the epitaxially grown III-N layer of the template (reference signs 105A and 105B, respectively) is substantially larger than a thickness of III-N material (reference signs 103A and 103B, respectively) below the interlayer with mask material (reference signs 102A and 102B, respectively), which is indicated by the respective breaks at the respective left-hand borders of the layers 100A/100B and 105A/105B.

In the FIGS. 1A and 1B in the same step (1) initially the provision of the respective substrates 100A and 100B is shown. The respective substrates can optionally be pre-treated as described above, in particular said substrates can respectively be subjected to a desorption step and a nucleation step. In such an optional desorption step for example hydrocarbon residues but also other volatile contaminants can be removed from the starting substrate or a structured or otherwise pre-treated substrate. During the desorption step the starting substrate is heated in the process to an elevated temperature, preferably to a temperature from 1100 to 1300° C., more preferably to a temperature from 1150 to 1250° C., for example approximately around 1200° C. Due to the temperature gradient within the substrate the substrate is typically subjected to a bending (bowing, curvature), normally with a concave curvature with respect to the surface on which subsequently the III-N material is deposited. Optionally, the desorption step can further be followed by nitriding with ammonia. A further optional step consists of lowering the temperature after desorption occurred, for example to a temperature between 400 and 600° C., preferably to a temperature between 450 and 550° C. During this cooling the—typically concave—curvature decreases again, for example to the level like in the beginning of the heating to the desorption step.

The provision and the pre-treatment of a substrate in the process for producing a template according to the present invention can preferably further comprise a nucleation step in which crystalline III-N material, especially minute III-N crystallites are grown onto the starting substrate. This step is schematically shown in the in this respect same step (2) of FIGS. 1A and 1B. The crystalline III-N material 101A and 101B, respectively, especially the III-N crystallites serve as seed crystals in the later further III-N crystal growth. III-N crystallites exhibit sizes from for example 1 to 40 nm with irregular forms, are generally present disorderedly on the starting substrate and suitably form initially a non-continuous nucleation layer. In the case of a low temperature GaN nucleation, this nucleation step typically takes place at a temperature from 400 to 600° C., preferably from 450 to 550° C. and more preferably from 500 to 540° C.

An AlN nucleation typically takes place at a temperature from 850 to 1050° C., preferably from 900 to 1000° C. and more preferably from 950 to 960° C.

During the low temperature nucleation step, optionally also during the subsequent heating to growth temperature, a re-crystallization can optionally occur.

After the provision of a substrate, optionally with the optional measures described above, the further steps of the respective embodiments according to the invention can vary with respect to time point and position/location of the layer of the mask material and the resulting consequences thereof, as is illustrated respectively separately in FIGS. 1A and 1B.

In the embodiment shown in FIG. 1A an interlayer made of mask material 102A is directly deposited already on the nucleation layer 101A, still before coalescence of the crystallites starts. In a further modification (not specifically shown here) this deposition of the interlayer is carried out not directly on the nucleation layer but only after a very short phase of a III-N growth, but still very close in the nanometer range to the nucleation layer, for example, at a distance in a range of up to 30 nm. In this distance range selected very close to the nucleation layer the subsequent steps occur practically analogous to the form shown in FIG. 1A.

In the embodiment shown in FIG. 1B, initially a III-N growth is carried out on the nucleation layer 100B for a particular, generally still relatively short time, for example until a small thickness of the crystalline III-N layer 103B of 30 nm or beyond and suitably up to approximately 300 nm has formed, preferably up to approximately 100 nm, more preferably up to approximately 50 nm, and only then an interlayer made of mask material 102B is deposited in the corresponding distance from the nucleation layer of the substrate.

Suitably and advantageously the deposition of the denoted interlayer 102A or respectively 102B is carried out in the same reactor with a process which is compatible with the technique for growing the III-N layer. For this purpose appropriate starting materials or reactive derived products or species of the mask material are reacted with each other in the reactor at appropriate temperature and further parameters which are suitable for the deposition of mask material. In its simplest form, a deposition of nitride mask material such as silicon nitride is carried out, because its deposition is well compatible with III-N deposition techniques. For this deposition, frequently same or similar, or at least compatible conditions with respect to reactor pressure and temperature can be chosen as for the III-N deposition and apart from that only suitable gas compositions and gas flow rates have to be adapted such that this process modification is easy to handle. For example, a silane gas and ammonia is flown into the reactor and reacted together at a suitable pressure and a suitable temperature of for example 800° C. to 1200° C., preferably at about 1050 to 1150° C. and is deposited in the form of $Si_3N_4$ and optionally further stoichiometric or over- or substoichiometric $Si_xN_y$ compositions on the prepared substrate (100A; 101A). The step of depositing mask materials other than SiN, such as for example TiN, $Al_2O_3$, $SiO_2$, WSi, and WSiN, can readily and accordingly be adjusted.

In this way a mask layer (102A and 102B, respectively) is formed on the nucleation layer (cf. FIG. 1A; 101A) or alternatively on the just growing III-N layer (cf. FIG. 1B; 101B), which is still very close to the nucleation layer. The mask layer can exhibit different forms. It is generally homogeneously distributed on the surface and may form a continuous layer, alternatively however it exhibits rather microscopic/nano-structured gaps; these possibilities are shown in the drawing schematically in the form of a dashed layer 102A or respectively 102B.

The thickness of the "interlayer" 102A or respectively 102B comprising respectively mask material is very small which can be set by corresponding gas flow rates and short process times; said thickness suitably lies in the nanometer or sub-nanometer range, for example below 5 nm, more preferably below 1 nm, in particular down to below one monolayer (i.e. 0.2 to 0.3 nm or less).

The distance of the interlayer 102A or respectively 102B from the substrate is small and suitably lies in the range of up to a maximum of 300 nm, for example at 1 to 200 nm and in particular at a few tens of nanometers, preferably 30 to 90 nm, more preferably 40 to 60 nm.

After depositing the interlayer with mask material, the (continued) growth of a III-N layer 104A, 104B (stage (4) in FIG. 1A/1B) is carried out immediately thereafter until the template at the end of the growth (stage (5) in FIG. 1A/1B) exhibits a III-N layer 105A, 105B with desired thickness in the range from 0.1 to 10 μm, preferably in the range from 3 to 10 μm (total thickness of the III-N layer of the template including the interlayer of the mask material and optionally nucleation layer). According to the invention it is made sure that the characteristics curvature (measured at the growth surface) and/or stress of the III-N layer of the template are favourably influenced and advantageously used for subsequent processes. In contrast to conventional methods, in which typically a concave curvature of the growth surface forms, which then in the course of further crystal growth, i.e. with increasing thickness of the III-N layer, increases further, according to the invention it is effected that the curvature of the template decreases during the subsequent further growth of a growing III-N layer 104A or respectively 104B, as shown schematically in the respective steps (4) of FIGS. 1A/1B. In the particular case of FIG. 1A it is made sure that immediately subsequent to the deposition of the interlayer of mask material 101A the growing III-N layer untypically bows negatively/convexly with the coalescing of this III-N layer, thus building up a desired compressive stress in the template. Although in the specific case of FIG. 1B in step (3) initially a slightly concave curvature with tensile stress in the III-N crystal 103B is present, it is however made sure in this case that the curvature at least increases significantly less compared to a situation without deposition of the mask layer 102B at suitable location/position, and that optionally even a decrease of the curvature is achieved and thus a curvature difference $K_s-K_e \geq 0$ is observed.

In the case that the desired curvature behaviour is not or is not on its own achieved by the position/location of the interlayer with mask material in a suitable distance with respect to the surface of the foreign substrate or respectively the nucleation layer, this behaviour can be controlled by additional and purposive setting of other process parameters for the purpose that a supplemental contribution to the relation $K_s-K_e \geq 0$ is provided, or that the template at growth temperature is essentially not bowed or is negatively bowed. An adjustment and optionally a variation of the III-N growth temperature is for this purpose a particularly suitable, new further process parameter. For the case of using sapphire as foreign substrate which has a higher thermal expansion coefficient than the III-N crystal to be grown the growth/the deposition occurs at a lowered growth temperature compared to that of the preceding growth. This change in temperature is carried out most effectively during a limited, preferably relatively early phase of the growth of the III-N layer of the template, and the growth is continued at this lowered temperature. A substantial curvature reduction with $K_s-K_e \geq 0$ is achieved supplementarily for example by carrying out growth in at least one growth phase of the III-N crystal of the template at a growth temperature decreased by at least 10° C. compared to that of the preceding growth. The decrease of the growth temperature is preferably at least 20° C. and lies more preferably in the range from 20 to 50° C. and in particular in the range from 25 to 40° C.

In the case of GaN a typical growth temperature lies for example in the range from 900° C. to 1200° C., preferably about 1020 to 1150° C., more preferably around approximately 1100° C.±20° C. In the case of AlGaN with an Al fraction from 30% up to 90% a typical growth temperature lies for example in the range from 1070 to 1250° C., preferably at 1090 to 1270° C., and more preferably at 1170° C. Temperatures for the deposition of other III-N materials are adjusted accordingly on the basis of the general common knowledge.

If optionally used and optionally desired, the system can, as described in the above denoted particular embodiment, initially be brought to a corresponding predetermined (first) temperature, wherein at this first temperature optionally only a re-crystallization occurs, and this temperature is then varied, however only to the extent of a changed (second) temperature at which still crystal growth and preferably epitaxial crystal growth can occur in order to eventually influence optionally the curvature behaviour additionally. When optionally used, this takes place preferably in the beginning or during the coalescence of the growing III-N crystallites or in the early phase of the growing III-N layer of the template. Because of the choice of sapphire as foreign substrate a decrease of the growth temperature is carried out. During continuing of the (preferably epitaxial) crystal growth in the range of the accordingly varied second growth temperature—i.e. below the respective first temperature—the respective curvature of the growth surface further decreases continuously or intermittently. As soon as a sufficient supplemental curvature decrease is achieved via this optional step of temperature variation, the temperature for the further growth of the III-N layer can be again freely selected, for example in the range of the typical growth temperatures mentioned above, such as for GaN and AlGaN.

The III-component, based on preceding steps such as during the formation of the initial III-N crystallites or respectively the nucleation layer on the substrate as described above can at the change to the step of the growth of the actual epitaxial III-N layer be kept the same, or alternatively it can be varied. The nucleation layer (cf. 102A or respectively 102B in FIGS. 1A/B) can for example be composed of GaN or AlN, and the epitaxial III-N layer of the template (cf. 104A-105A or respectively 104B-105B in FIGS. 1A/B) can independently therefrom be composed of GaN or AlGaN (preferably made of GaN). In a particular embodiment, the III-component is not changed.

Referring again to the embodiments according to FIGS. 1A and 1B specifically described here, according to the invention it is made sure that in the course of the further growth of the entire III-N layer 105A or respectively 105B of the template in the micrometer range (typically up to 10 µm) the curvature decreases further continuously by appropriate deposition of a single interlayer of the mask material 102A or respectively 102B, in the case of FIG. 1A with the tendency to further negative curvature values, in the case of FIG. 1B however—since starting from a slightly positive/convex curvature in stage (3)—towards a condition of an essentially absent curvature (cf. respectively stage (5) in FIGS. 1A/1B).

When the curvature value at the beginning of the crystal growth of the III-N layer or directly subsequently to the deposition of the interlayer of the mask material (such as for example in FIG. 1 approximately at stage (3)) is denoted "$K_s$," or respectively "$K_S$" ($K_{start}$) and the curvature value at a later time point (such as for example in FIG. 1 at stage (4)) and in particular towards the end of the growth of the III-N layer of the template (for example according to FIG. 1 at stage (5)) is denoted as "$K_e$" or respectively "$K_E$" ($K_{end}$), then the curvature difference ($K_s-K_e$) of the template exhibits, respectively measured at growth temperature, a positive sign. Preferably, $K_s-K_e$ is at least 5 km$^{-1}$, more preferably at least 10 km$^{-1}$. On the other hand the curvature difference ($K_s-K_e$) is preferably selected as not too large; it should thus preferably not be larger than 50 km$^{-1}$, more preferably not be larger than 20 km$^{-1}$.

By recognizing and actively influencing this behavior and the relationships associated therewith, the process according to the present invention enables the production of a template comprising a first III-N layer, wherein said template at epitaxial growth temperature is not bowed, in any case is essentially not bowed (as is illustrated for example in FIG. 1B stage (5)), or is negatively bowed (as for example illustrated in FIG. 1A stage (5)). Separated by dashed lines, the stages (5) and (6) illustrate the respective final conditions of the completely produced template, respectively at growth temperature (stage (5)) or respectively after cooling at room temperature (stage (6)).

In a preferred embodiment of the present invention all crystal growth steps described above in the first embodiment, including the optionally performed nucleation step, are carried out via Metal-Organic Vapor Phase Epitaxy (MOVPE). Alternatively or in combination the crystal growth steps described before can however also be performed via HVPE.

When layer thicknesses of suitably at least 0.1 µm, for example in the range from 0.1 to 10 µm, preferably from 2 to 7.5 µm of the III-N layer produced as described above are deposited on the substrate, a template is provided according to the invention, said template being excellently suited as starting template for further use or processing for the epitaxial growth of further layers and in particular of further III-N layers, and then the problem of the tendency to crack formation can be counter-acted, in particular when subsequently significantly thicker III-N layers such as III-N bulk crystals (ingots, boules) are grown or deposited. Suitable techniques for growing or depositing thicker III-N layers such as III-N bulk crystals can for example be selected from Vapor Phase Epitaxy (VPE) in particular Hydride Vapor Phase Epitaxy (HVPE), ammono-thermal processes, sublimation and the like.

An exemplary course of the process of the invention according to a possible embodiment is illustrated in FIG. 2. Therein the following parameters are plotted as a temporal profile: The change of the growing surface (discernable by the profile of the decreasing amplitude of the reflectivity, given in arbitrary units a.u. in the lower part of the figure) as well as the temperature (left-hand ordinate, upper line corresponding to process temperature, lower line corresponding to wafer temperature) and the change of the curvature (right-hand ordinate) of the growth surface. The measurement of the curvature of the growth surface is carried out in situ, performable with an EpicurveTT curvature measurement device by the company LayTec (Berlin, Germany), said device allowing to simultaneously obtain data on temperature, reflection and curvature of the growth surface.

Individual process stages or respectively phases are denoted in FIG. 2. These are correspondingly analogous to the depiction in FIG. 1. The phases which in FIG. 2 are denoted with "desorption" and "GaN nucleation" correspond to the stages denoted (1) and (2) in FIGS. 1A/1B and thus to the provision of a sapphire substrate. The interlayer with mask material is deposited without distance or respectively temporal delay and thus immediately on the nucleation (GaN or AlN nucleation; cf. FIG. 1A stage (3)), or close thereto or respectively after only short (optionally very short) growth duration (cf. FIG. 1B stage (3)), as shown in FIG. 2. The phase denoted with the term "GaN layer" corresponds to an epitaxial III-N "crystal growth" according to stages (4) to (5) of FIG. 1. In the course of the epitaxial III-N crystal growth which subsequently follows the deposition of the interlayer, the technical realization is recognizable that the curvature starting from $K_s$ decreases in the temporal course until at the end of the growth of the III-N (GaN) layer of the template the lower curvature $K_e$ is achieved, which in comparison to $K_s$ is smaller by approximately 20 to 30 km$^{-1}$. Finally, it can be cooled down to room temperature (cf. FIGS. 1A/B stage (6)). With such a procedure it becomes possible that the III-N (GaN) layer of the template at the end at growth temperature, i.e. at a thickness in the range of a few micrometers, is essentially not bowed; for example the curvature value ($K_e$) at epitaxial growth temperature can lie in the range of maximum ±30 km$^{-1}$, rather still around ±20 km$^{-1}$ around zero. The procedure can, if desired, be varied such that at the end $K_e$ at growth temperature is negative and that thus the template exhibits a convex curvature. After cooling to room temperature, the template has a clearly increased convex curvature and thus a markedly compressive stress. When this template is heated again to growth temperature at a desired time point—for example for growing a thick III-N bulk crystal, the condition with essentially absent or alternatively negative curvature is obtained again, which according to the surprising findings of the invention forms an excellent basis for further epitaxial III-N growth with decreased tendency to crack formation.

Figure 3:
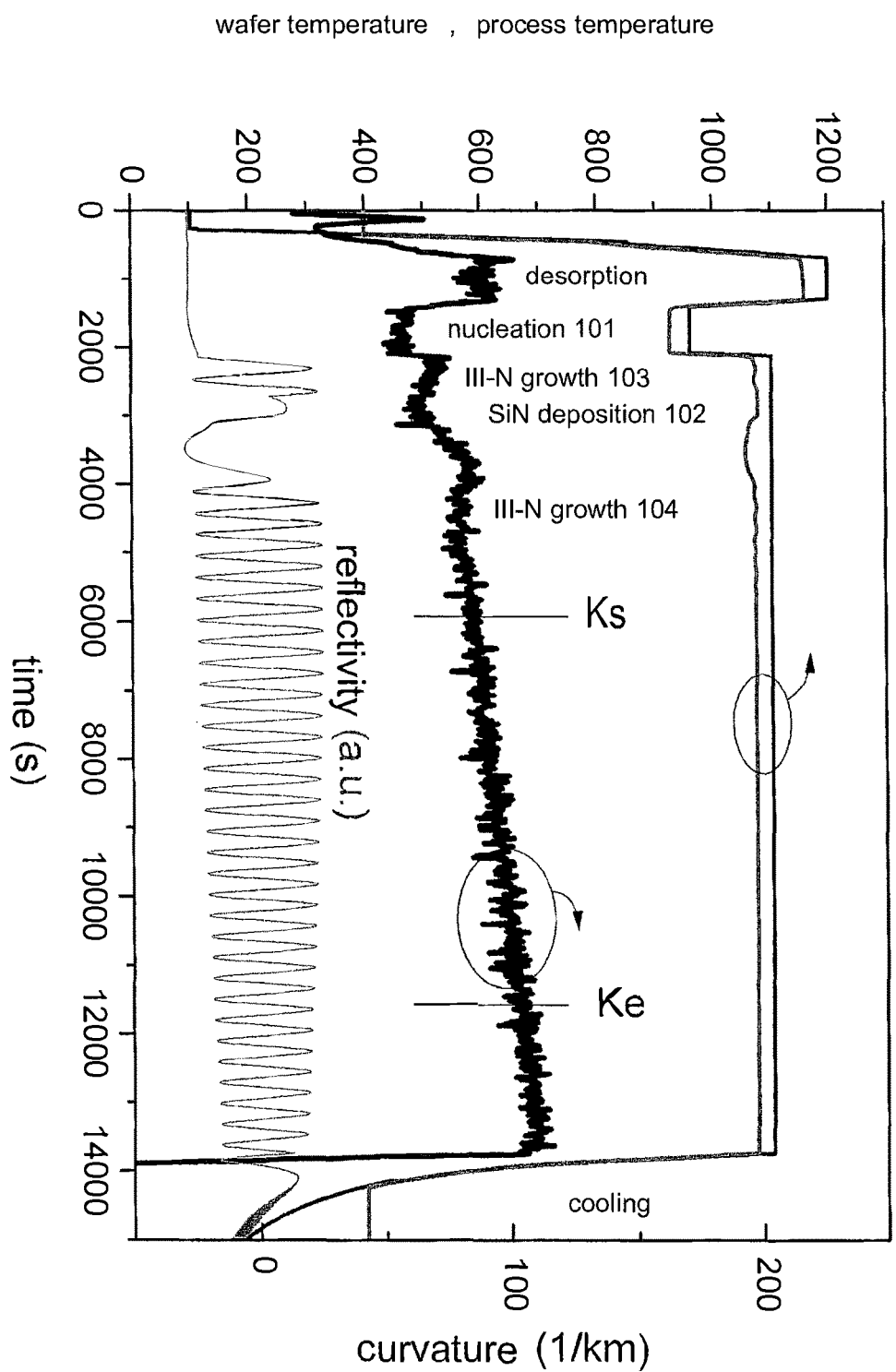
FIG. 3 illustrates temporal temperature, reflection and curvature profiles during growth of GaN on sapphire (distance 300 nm)

FIG. 3 shows a corresponding course (illustration and labeling as given in FIG. 2) based on sapphire samples as starting substrate, when, as opposed to in FIG. 2, an interlayer made of mask material is deposited significantly later (namely 300 nm). Contrary to the case of FIG. 2 in which the mask material-interlayer was deposited in the very small distance of 15 nm, in the case of FIG. 3 a concave curvature indeed increases (i.e. $K_s-K_e$ is <0). However, also the embodiment according to FIG. 3 shows that with a predetermined specification of the distance the degree of curvature in the obtained template can be purposively set as desired. Accordingly, the template of FIG. 3 after cooling to room temperature has a markedly lower convex curvature than the template of FIG. 2. In view of avoiding crack formation during further epitaxial III-N growth, in particular with thicker III-N layers, the deposition of the mask material-interlayer with very small distance (approximately from 0 nm to approximately 50 nm, cf. representatively FIG. 2 with exemplary distance of 15 nm) is strongly advantageous here in comparison to the result according to FIG. 3 with a distance of about 300 nm.

Figure 4:
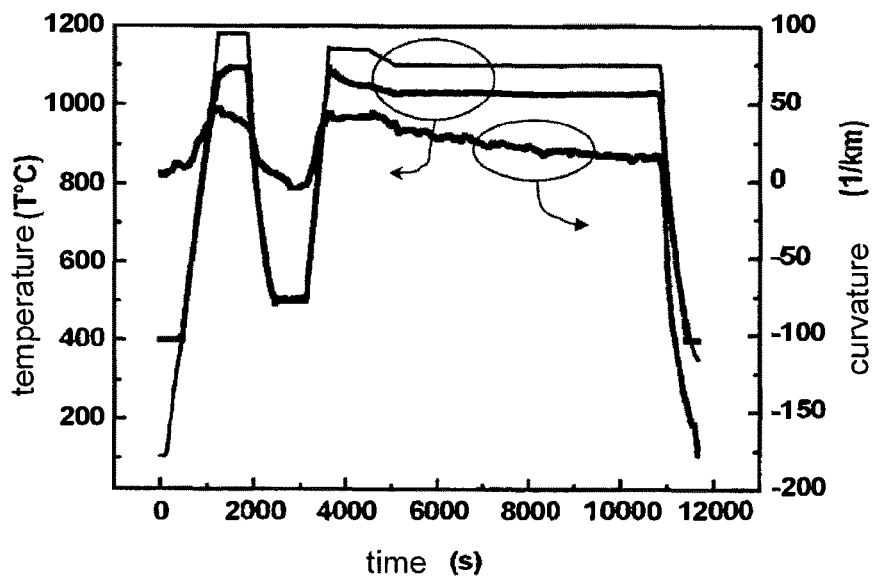
FIG. 4 shows the change of the curvature of the growth surface according to a different principle, in which optionally a deposition of an interlayer with mask material is combined with a change of the III-N growth temperature during the growth of the III-N layer of the template.

FIG. 4 schematically shows in a possible variant the change to be expected of the curvature of the growth surface (right-hand ordinate) and respectively applied temperature (left-hand ordinate, upper line corresponding to process temperature, lower line corresponding to wafer temperature) for the case of a possible further embodiment of the present invention, in which optionally a deposition of an interlayer with mask material is combined with a reduction of the III-N growth temperature during the growth of the III-N layer of the template. In this possible and optional embodiment, after providing a sapphire foreign substrate, which also comprises the deposition of a very thin GaN or AlN nucleation layer (discernable in the diagram in the phases of an initial high temperature phase with a subsequent low temperature phase) initially heating to growth temperature is again performed, then optionally followed by a—here not shown—re-crystallization phase, to then deposit an interlayer with mask material as described above, which can as described for example occur at a time point when already a III-N layer of above 50 nm or above 100 nm and or for example 300 nm, has grown. Additionally and in contrast to the basic embodiments illustrated in FIGS. 1 and 2, now however, either simultaneously with this interlayer deposition or in a particular, preferably short time period before or thereafter, a temperature decrease (cf. the temperature ramp of approximately 30° C. after increasing to growth temperature shown in FIG. 4) is applied, and then the growth of the III-N layer of the template is continued at this lowered temperature to obtain an additional contribution to the curvature reduction. In the overall result of this combination it is to be expected that the curvature of the template at the growth surface decreases in the course of the further growth, i.e. $K_s-K_e$ lies markedly above zero, as shown in principle in FIG. 4.

Alternatively to the temperature decrease for continued growth of the III-N layer of the template, further process parameters can be applied to provide for the observation of the relation $K_s-K_e>0$.

Figure 5A:
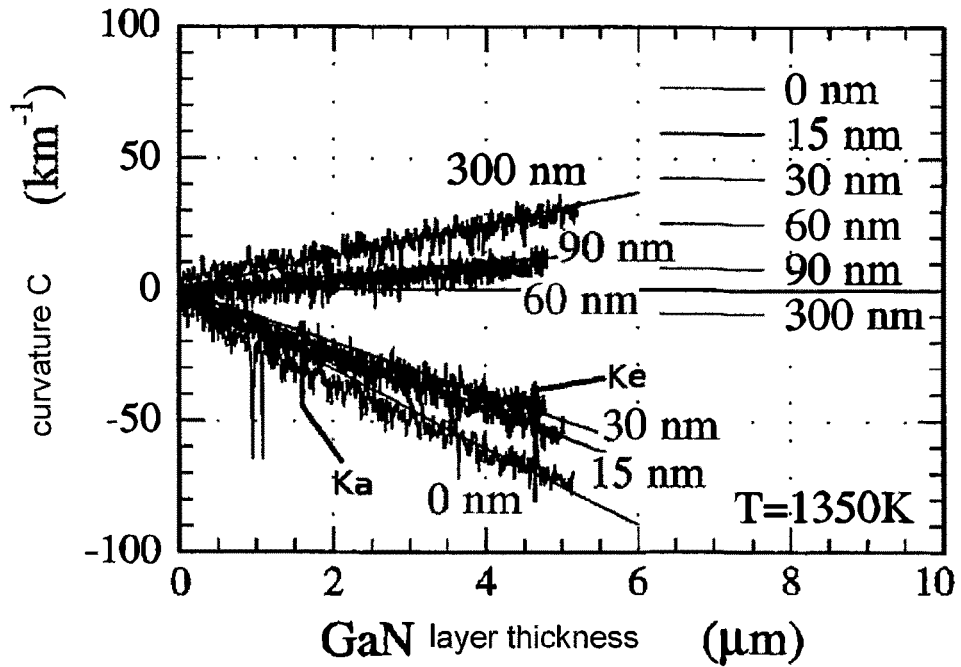
FIGS. 5A and 5B show the change of the curvature of the growth surface mainly in dependence on the provision and location/positioning of an interlayer with mask material according to different possible embodiments of the present invention.
Figure 5B:
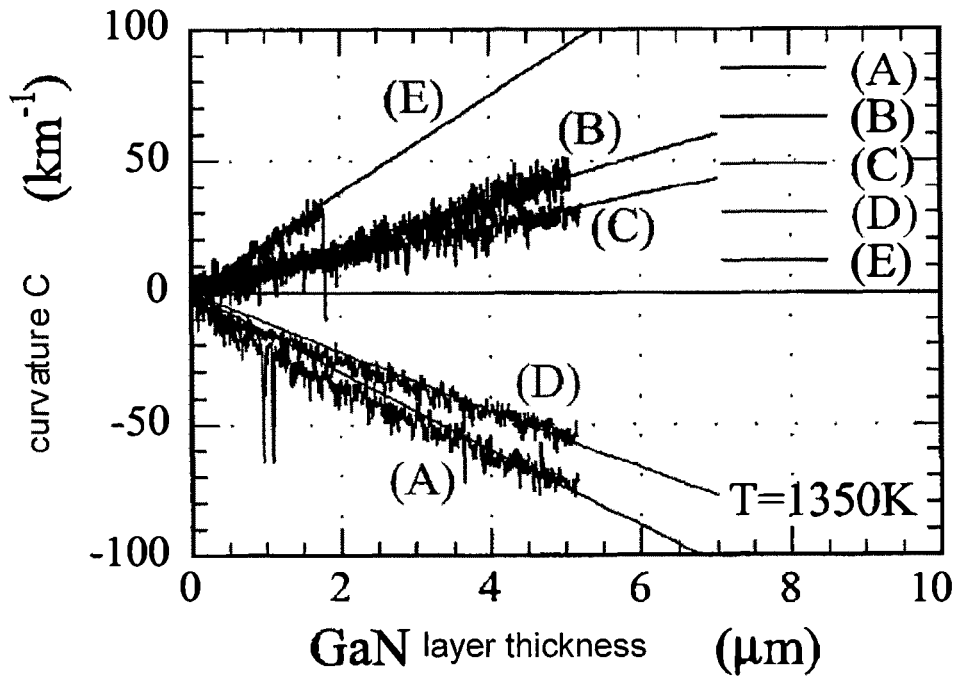
Figure 5C:
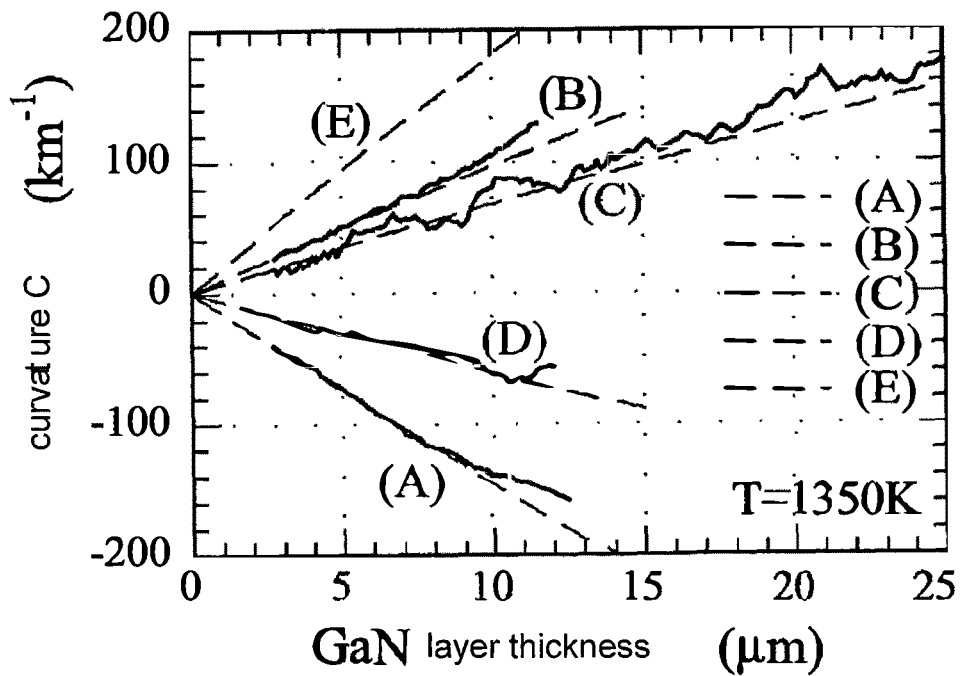
FIG. 5C shows the results with respect to curvature of the growth surface when the templates defined according to FIGS. 5A and 5B are subjected to a further III-N (GaN) layer growth for producing thicker layers.

From FIGS. 5A, 5B and 5C further possibilities and different embodiments for controlling curvature and/or stress in the III-N layer of the template, in order to grow on this basis at least one further III-N layer and optionally a thick bulk crystal with reduced tendency to crack formation on the template become apparent, wherein FIGS. 5B and 5C also contain results for comparisons without interlayer (respectively lines (B) and (E)). In FIGS. 5A-C the curvature behaviour of the III-N layer of the template at growth temperature is plotted against its thickness. In this connection, FIGS. 5A and 5B show the phase of the producing of corresponding templates, wherein here exemplarily as growth technique MOVPE was used, whereas FIG. 5C shows a later phase of the producing of thicker III-N (here GaN) layers using these corresponding templates, wherein here the HVPE growth technique was used, which is particularly well suited for producing thicker layers up to bulk crystals.

The results show a consistent trend that the curvature behaviour is significantly influenced by how the distance of a single interlayer of mask material is set with respect to sapphire starting substrate or respectively an optional nucleation layer thereon. It is apparent that for the used experimental constellation in the system sapphire/GaN used here, the condition of $K_s-K_e>0$ is safely observed for the cases of no distance (i.e. line "0 nm") and for the cases of distances "15 nm" and "30 nm" and still obvious for distances up to about 50 nm. For larger distances of above 50 nm, i.e. as shown at 60 nm, 90 nm and 300 nm, this condition is primarily not fulfilled, but surprisingly the increase of the curvature is comparatively strongly attenuated with the consequence that such an increase can be kept smaller than in cases in which no interlayer of mask material was deposited (cf. FIGS. 5B and C, comparative lines (B) and (E)), and in particular when growth was on a nucleation layer which was deposited at low temperature (LT-GaN-Nucl) (cf. FIGS. 5B and C, comparative line (E)). The procedure according to the present invention shows the significantly better controllability of favorable template properties as well as the possibility to precisely set template curvature as desired, which can be used for the further III-N epitaxial growth.

FIG. 5A thus confirms that the provision of only a single interlayer of mask material in a distance which is set in a controlled way relative to the sapphire starting substrate, optionally with an optionally formed nucleation layer thereon, allows a very precise setting and control of a desired curvature value. It can be further seen that when observing relevant factors such as distance of the interlayer of mask material and thickness of the grown III-N layer and thus the growth duration such a condition in the respective finished, substrate-bound III-N template can be set at which the template according to the alternative solution principle for avoiding crack formation at growth temperature is not or essentially not bowed or is negatively bowed, i.e. the curvature can be limited to at most 30 km$^{-1}$, better to at most 20 km$^{-1}$ or better still to at most 10 km$^{-1}$ or preferably can even be set to negative values. Furthermore, as described, it is possible to influence the difference in a supplementary fashion with further process parameters such as temperature variations during growth of the III-N layer of the template, and if desired to make sure that the particular relation of $K_s-K_e>0$ is safely observed.

The obtained template according to the invention exhibits advantageous properties and features, which will be further described in the following. As such it is an interesting commercial object, it can however also be further processed as template within further steps described below, directly subsequently or alternatively indirectly after providing, storing or shipping.

A template for producing of further III-N single crystal according to the present invention is in the temperature range of an epitaxial crystal growth not bowed or essentially not bowed, or it is negatively bowed. When for example for the template as substrate sapphire with a thickness ($d_{sapphire}$) of 430 µm (approximately, i.e. ±20 m) and as III-N crystal layer GaN with a thickness ($d_{GaN}$) of 7 µm (approximately, i.e. ±0.5 µm) is used or set, then the term "essentially not bowed" is preferably defined such that the curvature value ($K_e$) at epitaxial growth temperature lies in the range of maximum ±30 km$^{-1}$, preferably in the range of maximum ±10 km$^{-1}$ around zero; the term "not bowed" then denotes a $K_e$ value of approximately zero, for example 0±5 km$^{-1}$ and in particular 0±2 km$^{-1}$; and the term "negatively bowed" is then defined by a curvature at growth temperature in the range of below 0 km$^{-1}$, for example in the range up to −150 km$^{-1}$, more preferably in the range from −25 to −75 km$^{-1}$.

It is noted that when using other materials for III-N than GaN, the exact curvature value can vary; however, according to the invention the intended setting of a (essentially) non-curvature or a negative curvature is maintained. Furthermore, when setting different layer thicknesses, the curvature value can vary depending on the respective layer thicknesses analogous to the following simplified Stoney equation, according to which—as long as the film ($d_{III-N}$) is significantly thinner than the substrate ($d_{substrate}$)—the following relationship applies [wherein R=curvature radius and $\varepsilon_{xx}$=strain]:

$$1/R = 6*(d_{III-N}/d^2_{substrate})*\varepsilon_{xx}.$$

Assuming a very thin layer $\varepsilon_{xx}$ is considered to be constant, i.e. when the layer thicknesses change the system reacts with a change of R (the change of $\varepsilon_{xx}$ resulting from a change of the curvature is neglected). Thus, when using the exemplary materials sapphire and GaN, but for setting layer thicknesses ($d_{sapphire}/d_{GaN}$) other than the afore-mentioned, the curvature value lies depending on the respective layer thicknesses analogous to the Stoney equation in the following range:

$$K_{T(dGaN;dsapphire)} = K_{T(7\mu m)} \times (430 \text{ µm}) \times (430 \text{ µm}/d_{sapphire})^2 \times (d_{GaN}/7 \text{ µm}),$$

wherein in the case of choosing other materials this equation is calculated with respective values of $d_{substrate}/d_{III-N}$.

For a template according to the present invention this for example means further that when for 430 µm of sapphire and for a 3.5 to 4 µm thick GaN layer a curvature of 250 km$^1$ is present, for the same process a curvature of 425 km$^{-1}$ results for a sapphire wafer with a thickness of 330 µm.

It is further noted that the curvature at room temperature is changed compared to the curvature at growth temperature, and can possibly be markedly different. For example, when using sapphire as foreign substrate the template—as a result of the plastic deformation during the cooling from the growth temperature to room temperature, mainly due to the different crystalline thermal expansion coefficients of the different crystalline materials—is additionally imprinted with a stress (which is only produced through extrinsic compression). This is schematically illustrated in FIGS. 1A and 1B in a status of the final stage (6) of the produced template according to the present invention at room temperature, wherein in comparison to the final stage (5) at growth temperature respectively a markedly stronger negative curvature is present. Accordingly it is observed, supplementarily or alternatively, that for example for the materials sapphire and GaN the curvature at room temperature is specified in the range from $K_{T(7\mu m;\ 430\mu m)} < -200$ km$^{-1}$, preferably from −200 to −400 km$^{-1}$, preferably in the range from −300 to −350 km$^{-1}$; wherein again for cases of other layer thicknesses it is referred to the simplified Stoney equation, $$K_{T(dGaN;dsapphire)} = K_{T(7\mu m;430\mu m)} \times (430 \text{ µm}/d_{sapphire})^2 \times (d_{GaN}/7 \text{ µm}).$$

In a further preferred embodiment, the template at room temperature exhibits a curvature radius in the range from −4 to −6 m for the case of $d_{sapphire}$=430 µm and $d_{GaN}$=3.5 µm.

Another possibility to characteristically describe the product properties or structure properties of the template obtained according to the present invention is to specify the strain of the lattice constants or the stress.

The strain $\varepsilon_{xx}$ is defined as follows:

$$\varepsilon_{XX} = \frac{\text{lattice constant } a - \text{lattice constant } a_0}{\text{lattice constant } a_0}$$

wherein a denotes the actual lattice constant in the crystal and $a_0$ denotes the theoretical ideal lattice constant.

X-ray methods for determining absolute lattice constants are discussed in detail in M. A. Moram and M. E. Vickers, Rep. Prog. Phys. 72, 036502 (2009).

Thereby the determination is carried out using Bragg's Law $$n\lambda = 2d_{hkl} \sin \theta$$

initially for the lattice constant c from a 2theta-scan with three-axes-geometry in symmetrical reflexes such as for example 004. The ideal lattice constant according to V. Darakchieva, B. Monemar, A. Usui, M. Saenger, M. Schubert, Journal of Crystal Growth 310 (2008) 959-965) is $c_0$=5.18523±0.00002 Å. The determination of the lattice constant a is then carried out using the equation, $$\frac{1}{d^2_{hkl}} = \frac{4}{3}\frac{h^2 + k^2 + hk}{a^2} + \frac{l^2}{c^2}$$

also given for example in M. A. Moram and M. E. Vickers, Rep. Prog. Phys. 72 (2009) 036502, from asymmetrical reflexes hkl such as for example −105 in the 2theta-scan. According to V. Darakchieva, B. Monemar, A. Usui, M. Saenger, M. Schubert, Journal of Crystal Growth 310 (2008) 959-965), the ideal lattice constant $a_0$ for unstressed GaN can be assumed to be $a_0$=3.18926±0.00004 Å.

As to the background of the phenomena of intrinsic and extrinsic stress, among others considering lattice constants, cf. Hearne et al., Appl. Physics Letters 74, 356-358 (2007).

Furthermore, the properties can also be given by the stress $\sigma_{xx}$, wherein $$\sigma_{xx} = M_f \varepsilon_{XX} \qquad \text{(Hooke's formula)}$$

wherein $M_f$ denotes the biaxial elastic modulus. The determination of the stress $\sigma_{xx}$ is readily possible via Raman spectroscopy, for example as described in I. Ahmad, M. Holtz, N. N. Faleev, and H. Temkin, J. Appl. Phys. 95, 1692

(2004); therein the biaxial elastic modulus of 362 GPa is derived from the literature as a value, wherein a very similar value of 359 GPa can be taken from J. Shen, S. Johnston, S. Shang, T. Anderson, J. Cryst. Growth 6 (2002) 240; thus a suitable and consistent value for the biaxial elastic modulus $M_f$ is about 360 GPa.

A template according to the present invention exhibits in the temperature range of an epitaxial crystal growth a value of $\varepsilon_{xx} \geq 0$ (i.e. including $\varepsilon_{xx}=0$), but in particular of $\varepsilon_{xx}<0$. This value can be directly determined from an in situ measurement of the curvature.

Besides the presence of an interlayer with mask material, a template according to the present invention can further exhibit at room temperature a compressive stress of $\sigma_{xx}<-0.70$ GPa, and/or the strain $\varepsilon_{xx}$ of the template at room temperate can be set to a value in the range of $\varepsilon_{xx}<0$, preferably in the range $0>\varepsilon_{xx}\geq-0.003$, more preferably in the range $-0.0015\geq\varepsilon_{xx}\geq-0.0025$ (or $-0.0015>\varepsilon_{xx}\geq-0.0025$) and in particular in the range $-0.0020\geq\varepsilon_{xx}\geq\mathbf{-0.0025}$.

A suitable curvature measurement device, which is applicable in combination with an apparatus for vapor phase epitaxy, is for example the curvature measurement device of Laytec AG, Seesener Strasse, Berlin, Germany (cf. for example DE102005023302 A1 and EP000002299236 A1). These curvature measurement devices are well adapted to be combined with available equipments for vapor phase epitaxy, such as MOVPE, HVPE or MBE (Molecular Beam Epitaxy) and furthermore enable a measurement of the temperature at the wafer surface.

Accordingly after the epitaxial crystal growth a template is obtained which, based on the above-described properties, is suited to produce crystals of outstanding quality and with outstanding features in further epitaxial growth steps. The template according to the invention is thus excellently suited for the further use, it can also as such be provided, stored or shipped for further use, or it can be directly further used in an entire process.

A further aspect of the present invention is a process for producing III-N single crystals, wherein III denotes at least one element of the main group III of the periodic table of the elements, selected from Al, Ga and In, wherein the process comprises the following steps:

aa) providing a template which comprises a starting substrate comprising sapphire and at least one III-N crystal layer, wherein the starting substrate and the at least one III-N crystal layer are formed such that the template in the temperature range of an epitaxial crystal growth exhibits no or almost no curvature or exhibits a negative curvature, and bb) carrying out an epitaxial crystal growth for forming further III-N crystal on the template according to aa), optionally for producing a III-N bulk crystal, cc) optionally separating III-N single crystal or III-N bulk crystal and foreign substrate.

This aspect of the invention starts from the alternative solution principle of minimizing or eliminating altogether the risk of crack formation by the preconditions specified in the steps aa) and bb).

In a preferred embodiment, the template provided in the step aa) comprises the interlayer with mask material described above, wherein in this respect it is referred to the above description concerning the formation of the template exhibiting such an interlayer. In this aspect of the invention according to the alternative solution principle, the presence of such an interlayer is however not necessarily required, because the curvature condition defined in the step aa) can alternatively also be adjusted by other conditions, specifically by suitable temperature control and temperature variation during the III-N growth of the template, as is also described elsewhere in other passages.

As a result of imprinting lattice deformation and compressive stress according to the present invention, the condition of the template provided in the step aa) can also be defined in that the III-N crystal of the template at growth temperature exhibits a value of $\varepsilon_{xx}\leq 0$ (i.e. including $\varepsilon_{xx}=0$), but in particular a value of $\varepsilon_{xx}<0$, wherein the value lies preferably in the range from $0>\varepsilon_{xx}>-0.0006$, and more preferably in the range from $-0.0003>\varepsilon_{xx}>-0.0006$. At room temperature, a compressive stress of $\sigma_{xx}<-0.70$ GPa can be present. The strain $\varepsilon_{xx}$ at room temperature of the template according to the present invention exhibits preferably a value in the range from $0>\varepsilon_{xx}\geq-0.003$, more preferably in the range from $-0.0015\geq\varepsilon_{xx}\geq-0.0025$ (or $-0.0015>\varepsilon_{xx}\geq-0.0025$), and in particular in the range from $-0.0020\geq\varepsilon_{xx}\geq-0.0025$.

In a further embodiment of the present invention, III-N single crystals are produced which are obtained by—without or with interruption between the steps aa) and bb)—carrying out an additional epitaxial crystal growth on the template obtained according to the invention for forming further III-N crystal. Further epitaxial III-N crystal growth can be performed at a growth temperature which can be selected independently from the above-mentioned crystal growth temperatures.

Also other conditions of the further crystal growth on the template can now be chosen freely. Thus, III-N materials can be grown in which the III-component can be selected and varied as desired. Accordingly, at least one (optionally further) GaN, AlN, AlGaN, InN, InGaN, AlInN or AlInGaN layer(s) can be deposited for producing accordingly thicker III-N layers or III-N single crystals. Preferably, the III-N crystal layer of the template as well as the III-N crystal epitaxially grown thereon form a purely binary system, e.g. GaN, AlN or InN, or the III-N crystal layer of the template is a binary system, in particular GaN (at least mainly, since the nucleation layer can optionally be composed of a different material, such as for example AlN), and the III-N crystal epitaxially grown thereon is a binary or ternary III-N material which can be freely chosen, in particular again binary GaN.

Step bb) can follow step aa) immediately, alternatively the process can be interrupted in between. It is possible to change the reactor between the steps, which in turn enables the growth of III-N crystals in the step bb) via a different growth method than the one used for producing the template provided according to step aa), in order to choose optimum conditions for the respective steps. Thus, the additional epitaxial crystal growth on the template produced according to the invention is preferably carried out via HVPE. The advantageous selection of the step bb) under HVPE conditions enables high growth rates and accordingly the obtaining of thicker layers. However, also all steps of the process, relating to the entire growth including the template formation and the subsequent deposition of the further epitaxial III-N layer, can be carried out in a single equipment using a particular growth technique, for example only via HVPE, such that the steps aa) and bb) are performed in the same reactor.

According to the invention in the process for producing III-N single crystals according to the embodiments described above an epitaxial crystal growth on the provided template can be carried out such that after finishing the epitaxial growth with markedly reduced risk of crack formation thick III-N single crystals of very good crystal quality with layer thicknesses of at least 1 mm, preferably of at least 5 mm, more preferably of at least 7 mm and most preferably of at least 1 cm are obtained. Owing to the absence of cracks, the entire thickness of the bulk crystal can advantageously be used.

After finishing the epitaxial crystal growth for producing a III-N single crystal, the crack-free III-N single crystal can optionally be separated from the substrate (optional step cc)). In a preferred embodiment, this takes place via self-separation, such as during the cooling from a crystal growth temperature. In a further embodiment, the separation of III-N single crystal and the substrate can be performed by grinding-off, sawing-off or a lift-off process.

When the epitaxially grown III-N single crystal exhibits a sufficiently large thickness, wherein a so-called III-N boule or ingot is obtained, it is possible to separate this single crystal for forming a multitude of individual thin disks (wafers) using suitable methods. The separation of the single crystals comprises common methods for cutting or sawing of III-N single crystals. The wafers thus obtained are excellently suited as a basis for producing semiconductor devices and components, for example opto-electronic and electronic components. The wafers produced according to the present invention are well suited for use as power components, high-frequency components, light-emitting diodes and lasers.

In all of the process stages, in particular for the actual, epitaxially grown III-N layers of a III-N boule or ingot and correspondingly in the III-N single crystal for the obtained wafers the inclusion of dopants is possible. Suitable dopants comprise n-dopants as well as p-dopants and can comprise elements selected from the group consisting of Be, Mg, Si, Ge, Sn, Pb, Se and Te. For semi-isolating material suitable dopants can comprise elements selected from the group consisting of C, Fe, Mn and Cr.

In a further preferred embodiment, the crack-free III-N single crystal is composed of gallium nitride, and this crystal exhibits in the growth direction a lattice constant a in the range of $<a_0$, in particular in the range from 0.31829 nm$<$a$\leq$0.318926 nm. As reference value of the lattice constant $a_0$ of GaN here the value of $a_0$=0.318926 nm can be assumed (cf. V. Darakchieva, B. Monemar, A. Usui, M. Saenger, M. Schubert, Journal of Crystal Growth 310 (2008) 959-965). This corresponds approximately to a lattice constant c in the range from $0 \leq \varepsilon_{zz} < +0.0001$.

EXAMPLES

Example 1

As growth technique a MOVPE on pre-treated sapphire (which is subjected to a desorption and a nucleation) is used with the details given in the following. The temperatures given here relate to the nominally set temperature of the heaters; the temperature at the template or respectively the crystal is lower, in some cases up to about approximately 70 K lower (cf. FIGS. 2 and 3: here the heater temperature is denoted by the upper line and the measured temperature of the wafer support is given by the lower line).
Reactor:
  MOVPE reactor Aixtron 200/4 RF-S, single wafer, horizontal
Foreign Substrate:
  c-plane sapphire substrate, off-cut 0.2° in m-direction 430 µm thickness unstructured
Desorption Step (FIG. 1 (1); 100)
  Reactor pressure: 100 mbar
  Heating: from 400° C. to 1200° C. in 7 min
  Reactor temperature: 1200° C.
  Process temperature duration: 10 min in $H_2$ atmosphere
  Cooling to 960° C.
Nucleation Step (FIG. 1 (2); 101)
  Gas flows: 25 sccm trimethyl aluminium (TMAl), bubbler: 5° C.,
  250 sccm $NH_3$
  Cooling to 960° C.
  Opening of the valves
  Nucleation: 10 min
  Increase of the ammonia flow to 1.6 slm
T-Ramp; Optionally Crystal Growth (FIG. 1 (2) to Before (3); 103)
  Heating from 960° C. to 1100° C. in 40 sec
  Reactor pressure: 150 mbar, $H_2$ atmosphere
  Gas flows: optionally 16-26 sccm trimethyl gallium (TMGa), 2475 sccm $NH_3$
  Crystal growth time: 0-10 min (corresponding to 0-300 nm)
SiN Deposition (FIG. 1 (3); 102)
  Gas flows: 0.113 mol/min silane, 1475 sccm $NH_3$
  No TMGa
  Pressure: 150 mbar
  Temperature: 1100° C.
  Duration: 3 min
Further Crystal Growth: (FIG. 1 (4); 104)
  1100° C.
  reactor pressure: 150 mbar, $H_2$ atmosphere
  gas flows: 26 sccm TMGa, 2000 sccm $NH_3$
  crystal growth time 90-240 min, corresponding to 3-10 µm GaN thickness
  Growth end and cooling: (FIG. 1 (5)-(6))
  Switching-off of heating and TMGa flow
  Lowering of $NH_3$: 2000 sccm to 500 sccm in 40 sec
  Switching-off: $NH_3$ flow under 700° C.
  Switching-over: $NH_3$ flow to $N_2$ flow FIG. 5A shows the course of the curvature at growth temperature (1350° K), plotted against the thickness of the grown GaN layer and thus in the temporal course, distinguished respectively according to distance of the SiN ($Si_xN_y$) with respect to the AlN nucleation layer. In this respect the zero point relates to the beginning of the continued growth of the III-N layer 104A, 104B (i.e. after stage (3) and before or respectively during stage (4) in FIGS. 1A/1B). The curvature behaviour can be purposively and precisely controlled. The following Table 1 gives the in situ, i.e. measured at growth temperature, $\varepsilon_{xx}$ values and the curvature values C (km$^{-1}$) measured at room temperature and the $\varepsilon_{xx}$ values at room temperature determined from C towards the end of the template production with respective thicknesses of about approximately 7 µm.

TABLE 1

| distance AlN and SiN | Thickness (µm) | ε in-situ | C @ RT (km$^{-1}$) | ε @ RT |
| --- | --- | --- | --- | --- |
| 0 nm | 7.21 | −6.00E−04 | −396 | −2.27E−03 |
| 15 nm | 7.09 | −4.50E−04 | −365 | −2.13E−03 |
| 30 nm | 6.76 | −4.00E−04 | −367 | −2.24E−03 |
| 60 nm | 6.73 | 1.10E−04 | −298 | −1.83E−03 |
| 90 nm | 6.81 | 1.00E−04 | −299 | −1.82E−03 |
| 300 nm | 7.29 | 2.50E−04 | −293 | −1.66E−03 |

Example 2 and Comparative Examples

On selected templates produced according to Example 1 for which GaN layers with SiN interlayers directly on the nucleation layer (sample A) or after a very small (15-30 nm; sample D) or larger (300 nm; sample C) distances were deposited or according to Comparative Examples for which GaN was grown without SiN (sample B) or on low temperature GaN nucleation layer (sample E), the curvature was followed analogous to Example 1, namely in the range of a MOVPE growth to approximately 7 μm as shown in FIG. 5B, or during performing further HVPE growth to approximately 25 μm as shown in FIG. 5C. The results of the FIGS. 5B and 5C show once more the significantly better results regarding setting and behaviour of the curvature of the templates according to the invention (A), (C) and (D) compared to the comparative templates (B) and (E) without SiN interlayer.

Further Comparative Examples

In further Comparative Examples again similar experimental conditions can be used, except that no interlayer of mask material is deposited.

Figure 6:
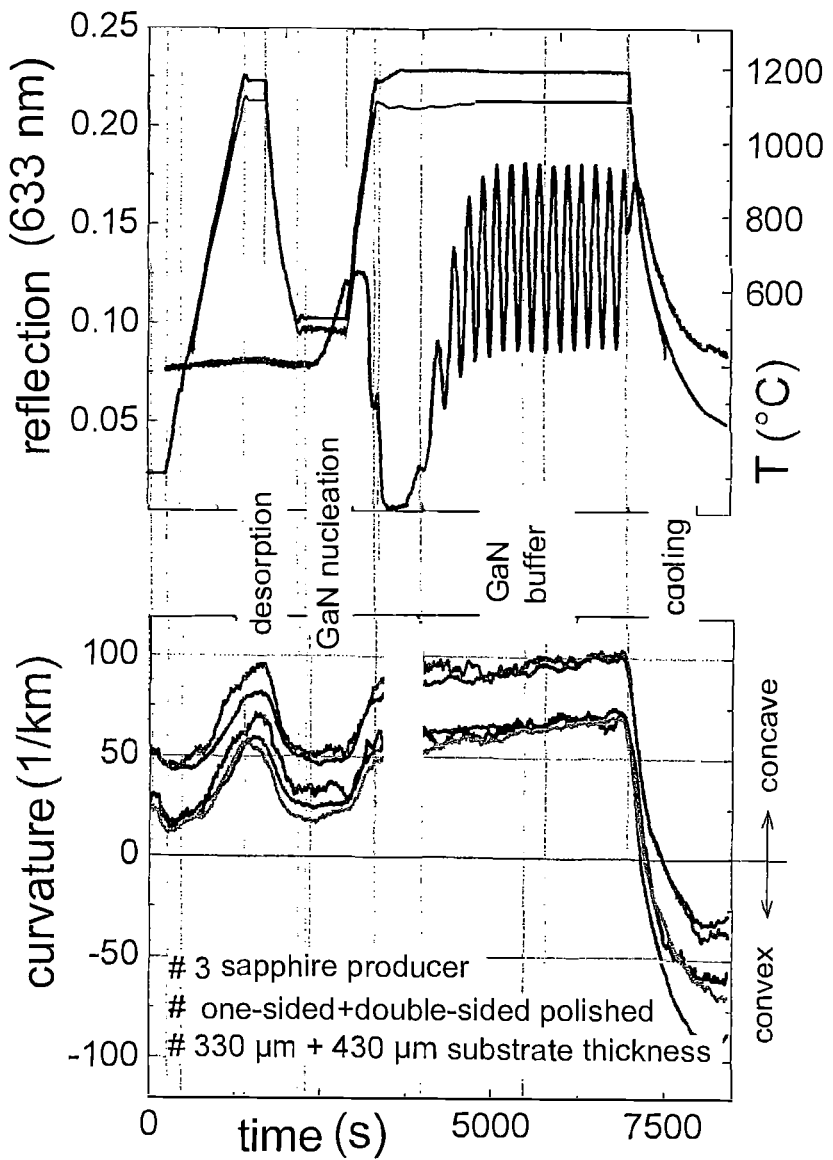
FIG. 6 illustrates temporal temperature, reflection and curvature profiles during conventional growth of GaN on sapphire.

FIG. 6 shows typical in situ data of the MOVPE growth of GaN on sapphire in a further Comparative Example, wherein in the bottom diagram the development of the curvature during the process for three different sapphire substrates is shown (cf. Brunner et al. in J. Crystal Growth 298, 202-206 (2007)). The arrows point to the curvature values $K_s$ and $K_e$ to be read off. With a curvature $K_s$ of 50 km$^{-1}$ and a curvature $K_e$ of 70 km$^{-1}$ here $K_s-K_e<0$ applies, i.e. the GaN layer is intrinsically stressed in a tensile manner at growth temperature. Through cooling this stress of the GaN layer is superimposed by an extrinsic compressive stress.

The invention claimed is:

1. A template comprising a substrate comprising sapphire and at least one III-N crystal layer, wherein III denotes at least one element of the main group III of the periodic table of the elements, selected from the group of Al, Ga and In, wherein in a region of the at least one III-N layer above the substrate comprises a mask material as an interlayer, wherein the III-N crystal layer of the template is defined by one or both of the following values (i)/(ii) of the deformation $\varepsilon_{xx}$:
   (i) at room temperature the $\varepsilon_{xx}$ value lies in the range of <0; and
   (ii) at growth temperature the $\varepsilon_{xx}$ value lies in the range of $\varepsilon_{xx} \leq 0$,
   wherein the interlayer is a discontinuous layer that, as viewed along a face surface of the template, the interlayer comprises nanometer-scale islands of mask material and microscopic and/or nanometer scale gaps lacking mask material.

2. The template according to claim 1, wherein in the III-N crystal layer of the template the $\varepsilon_{xx}$ value:
   (i) lies in the range of $0 > \varepsilon_{xx} \geq -0.003$ at room temperature; and
   (ii) lies in the range of $0 > \varepsilon_{xx} > -0.0006$ at growth temperature.

3. The template according to claim 1, characterized in that when, for the template, the substrate comprises sapphire with a thickness ($d_{sapphire}$) of approximately 430 μm (i.e. ±20 μm) and the III-N crystal layer comprises GaN with a thickness ($d_{GaN}$) of approximately 7 μm (i.e. ±0.5 μm) is used or set,
   a curvature of the template ($K_T$) at the growth surface of the crystalline III-N material
   (i) is in the range from 0 to −150 km$^{-1}$ at the growth temperature, and
   (ii) is in the range from −200 to −400 km$^{-1}$ at room temperature, wherein the curvature value depends on respective layer thicknesses ($d_{sapphire}/d_{GaN}$) analogous to the Stoney equation in the following range:

$$K_{T(dGaN;dsapphire)} = K_{T(7\mu m;430\mu m)} \times (430\ \mu m/d_{sapphire})^2 \times (d_{GaN}/7\ \mu m).$$

4. The template according to claim 1, wherein the at least one III-N crystal layer comprises one or more crystals selected from the group consisting of GaN, AlN, AlGaN, InN, InGaN, AlInN and AlInGaN.

5. The template according to claim 1, wherein the distance between the interlayer and the substrate is at most 300 nm.

6. The template according to claim 1, wherein the distance between the interlayer and the substrate is at most 50 nm.

7. The template according to claim 1, wherein the mask material is selected from the group consisting of Si$_3$N$_4$, TiN, Al$_2$O$_3$, SiO$_2$, WSi, and WSiN.

8. The template according to claim 1, wherein the mask material is deposited at a thickness of below 5 nm.

9. The template according to claim 1, wherein the mask material is deposited at a thickness of below 1 nm.

10. The template according to claim 1, wherein the mask material is deposited at a thickness 0.3 nm or less.

11. A template comprising a substrate comprising sapphire and at least one III-N crystal layer, wherein III denotes at least one element of the main group III of the periodic table of the elements, selected from the group of Al, Ga and In, wherein in a region of the at least one III-N layer above the substrate comprises a mask material as an interlayer, the interlayer being a discontinuous layer that, as viewed along a face surface of the template, comprises nanometer-scale islands of mask material and microscopic and/or nanometer scale gaps lacking mask material,
   wherein the distance between the interlayer and the substrate is at most 300 nm.

12. The template according to claim 11, wherein the distance between the interlayer and the substrate is at most 50 nm.

13. The template according to claim 11, wherein the mask material is selected from the group consisting of Si$_3$N$_4$, TiN, Al$_2$O$_3$, SiO$_2$, WSi, and WSiN.

14. The template according to claim 11, wherein the at least one III-N crystal layer comprises one or more crystals selected from the group consisting of GaN, AlN, AlGaN, InN, InGaN, AlInN and AlInGaN.

* * * * *